United States Patent
Hormis et al.

(10) Patent No.: US 11,101,842 B2
(45) Date of Patent: Aug. 24, 2021

(54) INTERFERENCE MITIGATION TECHNIQUES IN DIRECTIONAL BEAMFORMING REPEATERS

(71) Applicant: QUALCOMM Incorporated, San Diego, CA (US)

(72) Inventors: Raju Hormis, New York, NY (US); Navid Abedini, Somerset, NJ (US); Junyi Li, Chester, NJ (US); Juergen Cezanne, Ocean Township, NJ (US); Ozge Koymen, Princeton, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/843,340

(22) Filed: Apr. 8, 2020

(65) Prior Publication Data
US 2020/0336168 A1    Oct. 22, 2020

Related U.S. Application Data

(60) Provisional application No. 62/835,849, filed on Apr. 18, 2019.

(51) Int. Cl.
*H04B 1/525* (2015.01)
*H04B 1/26* (2006.01)
(Continued)

(52) U.S. Cl.
CPC ............. *H04B 1/525* (2013.01); *H04B 1/04* (2013.01); *H04B 1/26* (2013.01); *H04B 1/403* (2013.01);
(Continued)

(58) Field of Classification Search
CPC . H04B 1/04; H04B 1/26; H04B 1/403; H04B 1/525; H04B 2001/0416;
(Continued)

(56) References Cited

U.S. PATENT DOCUMENTS 3,757,335 A * 9/1973 Gruenberg ............... H01Q 3/42
342/367
4,901,307 A * 2/1990 Gilhousen ............ H04B 7/2041
370/320

(Continued)

FOREIGN PATENT DOCUMENTS

WO    WO-2019058159 A1    3/2019

OTHER PUBLICATIONS

International Search Report and Written Opinion—PCT/US2020/027528—ISA/EPO—dated Sep. 30, 2020.
(Continued)

*Primary Examiner* — James M Perez
(74) *Attorney, Agent, or Firm* — Qualcomm Incorporated

(57) ABSTRACT

Methods, systems, and devices for wireless communications are described that provide a repeater for beamforming a received signal at a first radio frequency via one or more scan angles or beamforming directions and then retransmitting and beamforming the transmitted signal at the first radio frequency via one or more scan angles or beamforming directions. Repeaters may perform heterodyning or downconverting on the received signal to reduce a frequency of the signal from the first frequency to an intermediate frequency (IF), and then band-pass filter the IF signal around a desired center frequency. The repeater may then heterodyne or upconvert the filtered IF signal back to the first frequency for the retransmission of the signal.

27 Claims, 23 Drawing Sheets

(51) Int. Cl.
*H04B 7/08* (2006.01)
*H04B 7/06* (2006.01)
*H04B 1/403* (2015.01)
*H04L 7/027* (2006.01)
*H04B 7/155* (2006.01)
*H04B 1/04* (2006.01)

(52) U.S. Cl.
CPC ......... *H04B 7/0617* (2013.01); *H04B 7/0842* (2013.01); *H04B 7/15535* (2013.01); *H04L 7/027* (2013.01); *H04B 2001/0416* (2013.01)

(58) Field of Classification Search
CPC ............... H04B 7/0617; H04B 7/0842; H04B 7/15535; H04L 7/027
See application file for complete search history.

(56) References Cited

U.S. PATENT DOCUMENTS

| | | | | |
|---|---|---|---|---|
| 6,473,467 | B1* | 10/2002 | Wallace | H04B 7/0417 |
| | | | | 375/267 |
| 6,952,454 | B1* | 10/2005 | Jalali | H04L 5/023 |
| | | | | 375/260 |
| 8,385,305 | B1* | 2/2013 | Negus | H04J 1/00 |
| | | | | 370/338 |
| 8,630,211 | B2* | 1/2014 | Gainey | H04B 7/15585 |
| | | | | 370/279 |
| 8,649,418 | B1* | 2/2014 | Negus | H04W 72/0453 |
| | | | | 375/211 |
| 9,325,370 | B2* | 4/2016 | Touret | H04B 7/18513 |
| 9,331,755 | B2* | 5/2016 | Castelain | H04L 27/2626 |
| 9,374,141 | B2* | 6/2016 | Murakami | H04B 7/0469 |
| 9,515,690 | B1* | 12/2016 | Chapman | H04B 1/26 |
| 2007/0021084 | A1* | 1/2007 | Wolf | H03L 7/06 |
| | | | | 455/260 |
| 2008/0225775 | A1* | 9/2008 | Proctor | H04B 7/15542 |
| | | | | 370/315 |
| 2009/0278596 | A1* | 11/2009 | Rofougaran | H04B 7/15542 |
| | | | | 329/302 |
| 2011/0189949 | A1* | 8/2011 | Fox | H04B 7/15578 |
| | | | | 455/15 |
| 2011/0244790 | A1* | 10/2011 | Kwak | H04B 7/15564 |
| | | | | 455/24 |
| 2012/0002586 | A1* | 1/2012 | Gainey | H04B 1/525 |
| | | | | 370/315 |
| 2014/0127989 | A1* | 5/2014 | Judd | G01S 19/25 |
| | | | | 455/24 |
| 2014/0226698 | A1* | 8/2014 | Negus | H04B 7/08 |
| | | | | 375/211 |
| 2015/0139070 | A1* | 5/2015 | Saha | H04B 7/18584 |
| | | | | 370/317 |
| 2016/0014705 | A1* | 1/2016 | Tani | H04W 72/046 |
| | | | | 370/252 |
| 2016/0094318 | A1* | 3/2016 | Shattil | H04B 1/0003 |
| | | | | 375/267 |
| 2016/0329953 | A1* | 11/2016 | Smart | H04B 7/0617 |
| 2017/0111161 | A1* | 4/2017 | Raggio | H04W 72/042 |
| 2017/0318589 | A1* | 11/2017 | Negus | H04L 5/0007 |
| 2018/0248676 | A1* | 8/2018 | Raggio | H04W 88/08 |
| 2019/0089434 | A1* | 3/2019 | Rainish | H04B 7/086 |
| 2019/0191419 | A1* | 6/2019 | Liu | H04B 7/15528 |
| 2019/0222296 | A1* | 7/2019 | Khandani | H04B 7/00 |
| 2020/0266879 | A1* | 8/2020 | Chia | H04B 7/15535 |
| 2020/0336168 | A1* | 10/2020 | Hormis | H04B 1/525 |
| 2020/0358501 | A1* | 11/2020 | Hormis | H04W 56/001 |
| 2020/0367257 | A1* | 11/2020 | Hormis | H04B 7/155 |
| 2021/0037574 | A1* | 2/2021 | Li | H04W 16/28 |
| 2021/0051679 | A1* | 2/2021 | Abedini | H04B 7/0695 |
| 2021/0067237 | A1* | 3/2021 | Sampath | H04B 7/15542 |
| 2021/0068050 | A1* | 3/2021 | Sampath | H04W 48/12 |

OTHER PUBLICATIONS

Partial International Search Report—PCT/US2020/027528—ISA/EPO—dated Jul. 3, 2020.
Simon M., et al., "Optimum Performance of Suppressed Carrier Receivers with Costas Loop Tracking", IEEE Transactions on Communications, IEEE Service Center, Piscstaway NJ. USA, vol. 25. No. 2, Feb. 1, 1977 (Feb. 1, 1977), pp. 215-227, XP011413130, ISSN: 0090-6778. DOI, 10.1109/TCOM.1977.1093805Abstract, Section I. II.B. III, figures 1.8.9.

* cited by examiner

INTERFERENCE MITIGATION TECHNIQUES IN DIRECTIONAL BEAMFORMING REPEATERS

CROSS REFERENCE

The present Application for Patent claims the benefit of U.S. Provisional Patent Application No. 62/835,849 by HORMIS et al., entitled "INTERFERENCE MITIGATION TECHNIQUES IN MILLIMETER-WAVE REPEATERS," filed Apr. 18, 2019, which is assigned to the assignee hereof and expressly incorporated by reference herein.

BACKGROUND

The following relates generally to wireless communications, and more specifically to interference mitigation techniques in directional beamforming repeaters, and in certain aspects with regard to millimeter-wave (mmWave) signaling.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

In some deployments, wireless communications systems may implement wireless repeaters for repeating and extending signals received from base stations to UEs and from UEs to base stations. Some wireless signals may be limited by path-loss through the air, interference from physical blockers, or other constraints. In some cases, wireless repeaters suffer from radiation leakage, in which transmission signals from the repeater "leak" back to the reception path, which may cause instability in the repeater and affect signal quality. Further, one or more transmitting interfering devices, or jammers, may be located in proximity to a UE, a base station, or a repeater.

SUMMARY

The described techniques relate to improved methods, systems, devices, and apparatuses that support interference mitigation techniques in millimeter-wave (mmWave) repeaters. In various aspects, the described techniques provide a repeater for beamforming a received signal at a first radio frequency via one or more scan angles or beamforming directions and then retransmitting and beamforming the transmitted signal at the first radio frequency via one or more scan angles or beamforming directions. Repeaters operating according to various aspects of the present disclosure may perform heterodyning or downconverting on the received signal to reduce a frequency of the signal from the first frequency to an intermediate frequency (IF), then band-pass filter the IF signal around a desired center frequency. The repeater may heterodyne or upconvert the filtered IF signal back to the first frequency for the retransmission of the signal. In some cases, a repeater may further include a signal processing chain connected to route the signal between reception at the first antenna array and retransmission at the second antenna array. The signal processing chain may include a heterodyning component that uses a local oscillator that may be tuned based at least in part on an output of a carrier tracking component that provides carrier tracking of the first frequency.

A method of wireless communication is described. The method may include receiving, at a first antenna array of a wireless repeater via directional beamforming, a first signal at a first frequency, downconverting the first signal to an IF signal at an IF, where the IF may be lower than the first frequency, filtering the IF signal to reduce interference from outside of a frequency window around the IF to generate a filtered IF signal, upconverting the filtered IF signal to generate a second signal at a second frequency, where the second frequency may be higher than the IF, and transmitting the second signal via directional beamforming at a second antenna array of the wireless repeater.

An apparatus for wireless communication is described. The apparatus may include a processor, memory in electronic communication with the processor, and instructions stored in the memory. The instructions may be executable by the processor to cause the apparatus to receive, at a first antenna array of a wireless repeater via directional beamforming, a first signal at a first frequency, downconvert the first signal to an IF signal at an IF, where the IF may be lower than the first frequency, filter the IF signal to reduce interference from outside of a frequency window around the IF to generate a filtered IF signal, upconvert the filtered IF signal to generate a second signal at a second frequency, where the second frequency may be higher than the IF, and transmit the second signal via directional beamforming at a second antenna array of the wireless repeater.

Another apparatus for wireless communication is described. The apparatus may include means for receiving, at a first antenna array of a wireless repeater via directional beamforming, a first signal at a first frequency, downconverting the first signal to an IF signal at an IF, where the IF may be lower than the first frequency, filtering the IF signal to reduce interference from outside of a frequency window around the IF to generate a filtered IF signal, upconverting the filtered IF signal to generate a second signal at a second frequency, where the second frequency may be higher than the IF, and transmitting the second signal via directional beamforming at a second antenna array of the wireless repeater.

A non-transitory computer-readable medium storing code for wireless communication is described. The code may include instructions executable by a processor to receive, at a first antenna array of a wireless repeater via directional beamforming, a first signal at a first frequency, downconvert the first signal to an IF signal at an IF, where the IF may be lower than the first frequency, filter the IF signal to reduce interference from outside of a frequency window around the IF to generate a filtered IF signal, upconvert the filtered IF signal to generate a second signal at a second frequency, where the second frequency may be higher than the IF, and transmit the second signal via directional beamforming at a second antenna array of the wireless repeater.

DETAILED DESCRIPTION

Figure 1:
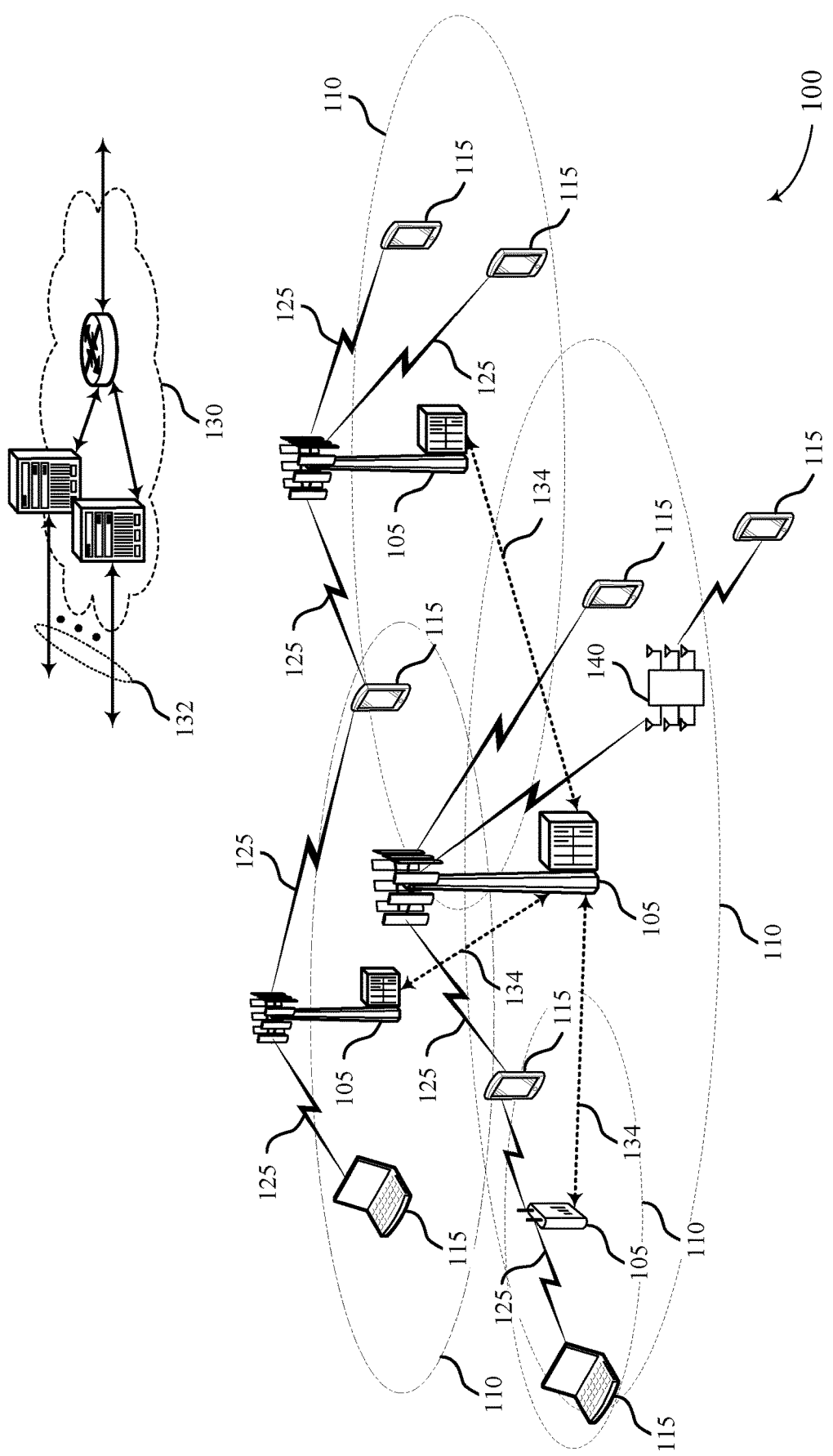
FIG. 1 illustrates an example of a system for wireless communications that supports interference mitigation techniques in directional beamforming repeaters in accordance with aspects of the present disclosure.

A wireless repeater may repeat, extend, or redirect wireless signals received from a base station to a user equipment (UE), from the UE to the base station, or any combinations thereof. For example, the repeater may receive a signal from a base station and retransmit the signal to a UE, or receive a signal from a UE and retransmit the signal to the base station. In various aspects of the present disclosure, a wireless repeater may use beamformed transmission beams for receiving and retransmitting signals. Such techniques may be employed, in some examples, in systems that use millimeter-wave (mmWave) communications with relatively narrow beams. In some cases, repeaters may perform interference mitigation to further enhance the reliability of communications between a UE and a base station. According to various aspects of the present disclosure, wireless repeaters may perform filtering on a signal to reduce, or eliminate, interference from physical obstacles, jamming devices, radiation leakage of the repeater itself, or any combination thereof.

In some cases, a repeater may perform heterodyning, or downconverting, on a received signal to reduce a frequency of the signal from the first frequency to an intermediate frequency (IF), then band-pass filter the IF signal around a desired center frequency. The repeater may heterodyne, or upconvert, the filtered IF signal back to the first frequency for the retransmission of the signal. In some cases, a repeater may further include a signal processing chain connected to route the signal between reception at the first antenna array and retransmission at the second antenna array. The signal processing chain may include a heterodyning component that uses a local oscillator that is tuned based on an output of a carrier tracking component that provides carrier tracking of the first frequency.

In some cases, the repeater may be a phased array repeater with an array of reception antennas, an array of transmission antennas, a signal processing chain, or a combination thereof, which may be used to process the received signals, filter the received signals, and retransmit the signals. In some cases, the array of reception antennas and the array of transmission antennas may be the same set of dual pole antennas, which may function in a first polarization as the reception antenna array and a second polarization as the transmission antenna array. The signal processing chain may be implemented as a radio-frequency integrated circuit (RFIC) (e.g., monolithic microwave integrated circuits (MMICs)) and may include a series of phase shifters for controlling the beam width and direction in the reception antenna array and/or the transmission antenna array, heterodyning components to convert signals between RF and IF, and in some cases filtering components. In some cases, the filtering components may be located off the RFIC (e.g., as a separate surface acoustic wave (SAW) or bulk acoustic wave (BAW) filter).

In some cases, carrier tracking of the received signal may be used to tune a local oscillator that may be used for heterodyning. Such carrier tracking may compensate for drifting of the local oscillator that may occur due to, for example, injection pulling at the local oscillator from the higher frequency transmissions at the first frequency, heat-based drift of the local oscillator, mechanical vibration, draft at the remote local oscillator used to generate the first frequency, phase noise, or any combinations thereof. In some cases, carrier tracking adjustments may be made based on a low-band connection between the repeater and the base station or UE. For example, the repeated beamformed transmissions may be millimeter-wave (mmWave) transmissions using a relatively high frequency band (e.g., the 30 gigahertz (GHz) band, or higher, which may be referred to as frequency range 2 (FR2)), and the separate low-band connection may be established using a relatively low frequency band (e.g., at less than 6 GHz, which may be referred to as sub-6 communications or frequency range 1 (FR1)). In some cases, the low-band connection may be a narrowband Internet-of-Things (NB-IoT) connection. The repeater in such cases may use frequency information from the low-band connection as an input to tune the local oscillator. In other cases, the local oscillator may be tuned using a non-linearity and divider to extract integer multiples of carrier frequency that are provided to a phase locked loop (PLL) that tunes the local oscillator. In further cases, the local oscillator may be tuned using an analog-domain synchronization signal block (SSB) detection and tracking that are provided to the PLL. In other cases, the local oscillator may be tuned using a Costas loop PLL. Alternatively, in some cases, a free-running local oscillator may not perform carrier tracking.

In some cases, the series of phase shifters of the RFIC may be controlled by one or more beam controllers (e.g., beamformers). In some cases, the signal processing chain may further include a feedback path for real-time gain control to increase stability within the signal processing chain, in which the feedback path may detect an output of a power amplifier (PA) and adjust a gain to a driver to the PA to improve or maintain signal stability within the RFIC. In some cases, the gain to one or more low noise amplifiers (LNAs) of the signal processing chain may be adjusted based on the output of the PA.

Such techniques may provide more reliable and enhanced communications between a UE and a base station. For example, a system having one or more repeaters operating according to techniques such as described herein may allow for beamformed communications even in the presence of one or more physical blockers (e.g., in non-line-of-sight (NLOS) scenarios such as urban-micro or indoor-hotspot deployments), one or more RF jammers (e.g., adjacent channel, in-band, or out-of-band jammers that may transmit signals that interfere with the beamformed communications between the UE and the base station), or a combination. By boosting the desired signal, repeaters as discussed herein, may improve the performance of served UEs in the presence of such jammers, physical blockers, or both. Additionally, repeaters that heterodyne signal to IF for filtering may provide for lower cost and lower complexity components within the repeater, as filtering, amplification, and beamforming are relatively less complex at frequencies that are below mmWave frequencies of the beamformed transmissions. Repeaters may also filter adjacent-channel leakage (e.g., emissions) from PAs that couple back into the receive path of the repeater. Thus, repeaters using techniques as discussed herein may provide a secondary low-loss and un-jammed path between a base station and UE.

Aspects of the disclosure are initially described in the context of a wireless communications system. Aspects of the disclosure are further described in the context of block diagrams of a wireless repeater, circuit diagrams of integrated circuits within the wireless repeater, and process flows. Aspects of the disclosure are further illustrated by and described with reference to apparatus diagrams, system diagrams, and flowcharts that relate to interference mitigation techniques in directional beamforming repeaters.

FIG. 1 illustrates an example of a wireless communications system 100 that supports interference mitigation techniques in directional beamforming repeaters in accordance with aspects of the present disclosure. The wireless communications system 100 includes base stations 105, UEs 115, one or more repeaters 140, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), NB-IoT, enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging. In some cases, repeater 140 may be an MTC or IoT device that is controlled by a base station 105 or UE 115 via a low-band or NB-IoT connection and performs repeating of received signals without demodulation or decoding of such signals based on control information provided by the low-band or NB-IoT connection.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support mmWave communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology (RAT), or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g., synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in part on a signal that was transmitted in different beam directions. For example, a UE 115 may receive one or more of the signals transmitted by the base station 105 in different directions, and the UE 115 may report to the base station 105 an indication of the signal the UE 115 received with a relatively high signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmWave receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a relatively high signal strength, relatively high signal-to-noise (SNR) ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARD) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth. Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

Wireless communications system 100 may include one or more wireless repeaters 140. The wireless repeaters 140 may include functionality of base station 105 and/or UE 115 for repeating, extending, and/or redirecting wireless signals. In some cases, a wireless repeater 140 may be used in line of site (LOS) or NLOS scenarios. In a LOS scenario, transmissions, such as mmWave transmissions, may be limited by path-loss through air, which may be overcome using beamforming techniques at the wireless repeater 140. In a NLOS scenario, such as in an urban area or indoors, mmWave transmissions may be limited by signal blocking or signal interfering physical objects. A mmWave beamforming repeater 140 may be utilized to receive a signal from a base station 105 and transmit the signal to the UE 115 and/or receive a signal from a UE 115 and transmit the signal to the base station 105. Beamforming, filtering, and gain control techniques may be utilized to improve signal quality between the base station 105, repeater 140, and UE 115 by isolating signals (e.g., via beamforming) and improving or maintaining stability within a signal processing chain of the repeater (e.g., via filtering, gain control, or combinations thereof).

The wireless repeater 140 may include an array of reception antennas and an array of transmission antennas. In some cases, the array of reception antennas and the array of transmission antennas comprise the same set of dual-pole antennas, where the dual pole antennas function in a first polarization as the array of reception antennas and the dual pole antennas function in a second polarization as the array of transmission antennas. In some cases, the antennas comprise meta-material antennas or antenna arrays. The repeater 140 may further include a beam control system and heterodyning circuits, which may comprise a system on chip (SoC) for controlling transmit and/or receive beams to reduce signal interference from jammers, physical blockers, or leakage caused by retransmission. In some cases, the SoC of repeater 140 may include a filter (e.g., a band-pass filter (BPF)) to reduce unwanted signals from the repeated signal. In other cases, such a filter may be located of the SoC (e.g., an off-chip SAW or BAW filter).

In some cases, the wireless repeater 140 is an analog RF repeater, and the wireless repeater 140 may include a signal processing chain connected (e.g., coupled, linked, attached) between the array of reception of antennas and the array of transmission antennas. The signal processing chain may be implemented as an RFIC, which may include RF/microwave components such as one or more phase shifters, LNAs, PAs, PA drivers, heterodyning mixers, carrier tracking circuits, gain controllers, power detectors, filters, or other circuitry. The phase shifters may be controlled by one or more beam controllers for beamforming to reduce signal interference. The heterodyning mixers may downconvert a frequency of a received signal to an IF, that may be filtered by the one or more filters, and the heterodyning mixers may increase the IF frequency of the filtered IF signal back to the higher frequency. The signal processing chain may include a feedback path for monitoring the output of one or more PAs, and adjusting gains to one or more PA drivers to the PAs and gains to one or more LNAs based on the output. The gain adjustment may function to stabilize the signal reception and transmission and improve signal quality between devices such as base station 105 and UE 115. Accordingly, through beamforming, heterodyning, filtering, and gain control, signal quality (e.g., mmWave signals) may be improved in LOS and NLOS scenarios.

As described, the wireless repeater 140 may include components (e.g., antenna arrays and signal processing chain circuitry) in the analog/RF domain. Accordingly, the wireless repeater 140 may not include digital components for demodulating or decoding the beamformed transmissions, although in some cases the wireless repeater 140 may include digital circuitry for receiving control information (e.g., for receiving remote configuration of gain, direction, and local oscillator tracking via a low-band or FR1 connection such as an NB-IoT connection). In some cases, the control information may be received using a different RAT than used between the base station 105 and UE 115. For example, one or more side channels may be used to provide control information and implemented as Bluetooth, ultra-wide band, wireless LAN, etc. protocols, and as such, the repeater may include circuitry and/or processors for receiving and processing signals received via those protocols and controlling beamforming at the RF components based on those signals received at the side channel.

Figure 2:
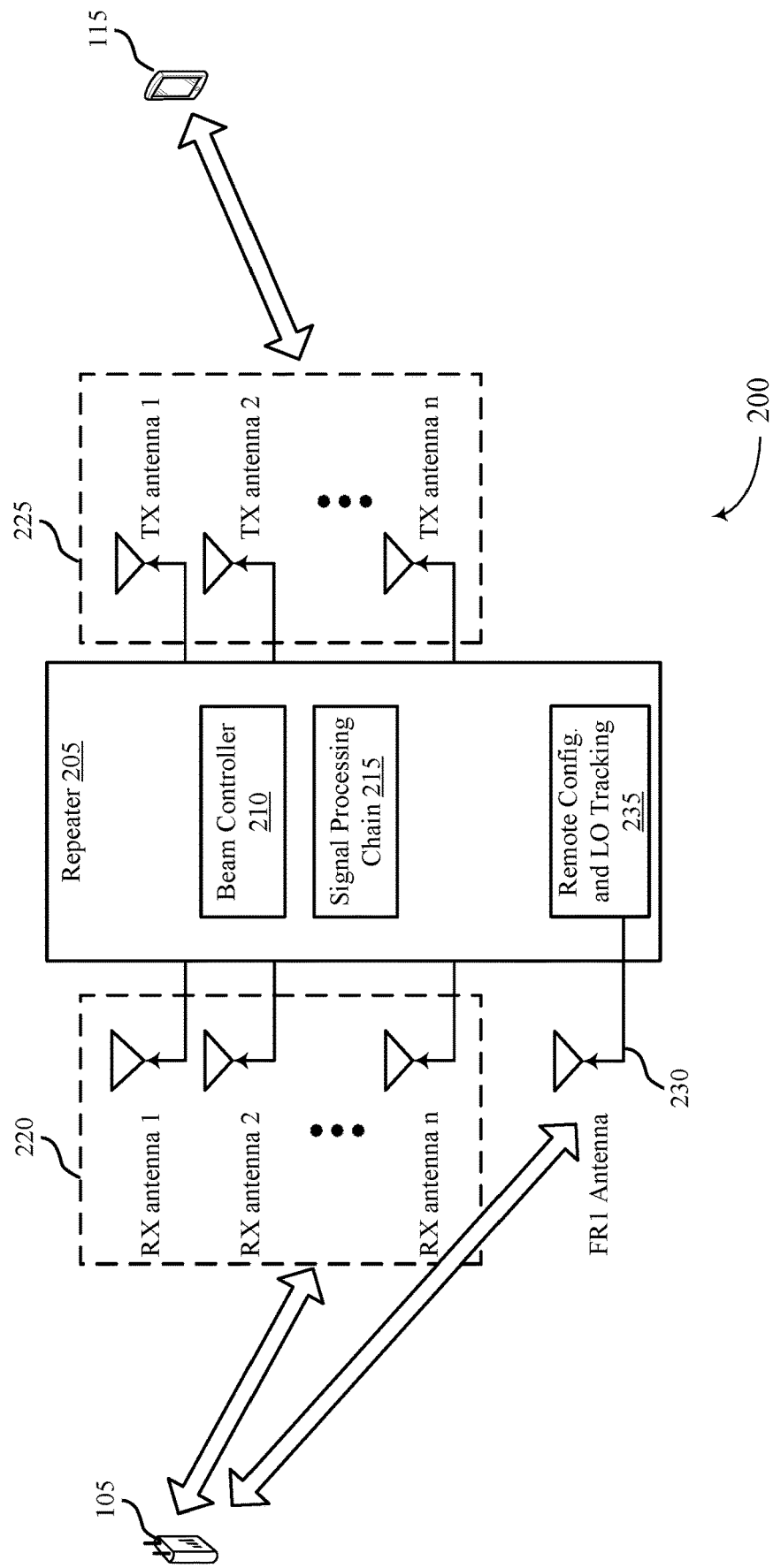
FIG. 2 illustrates an example of a block diagram of a configurable beamforming repeater that supports interference mitigation techniques in directional beamforming repeaters in accordance with aspects of the present disclosure.

FIG. 2 illustrates an example of a block diagram 200 of a configurable beamforming repeater 205 that supports interference mitigation techniques in directional beamforming repeaters in accordance with aspects of the present disclosure. In some examples, the devices of FIG. 2 may implement aspects of wireless communications system 100, and the repeater 205 may be an example of the repeater 140 of FIG. 1. The block diagram 200 includes a base station 105 and a UE 115. The repeater 205 includes a reception antenna array 220 including a set of antennas, and a transmission antenna array 225 including a set of antennas. In some cases, the reception antenna array 220 and the transmission antenna array 225 are the same antenna arrays including the same set of dual pole antennas functioning in first and second polarizations as the reception and the transmission antenna array. In some cases, the reception antenna array 220 and/or the transmission antenna array 225 comprise meta-material antennas.

The repeater 205 may further include a beam controller 210 and a signal processing chain 215, which may include various circuitry including one or more PAs, LNAs, phase shifters, dividers, heterodyning mixers, filters, combiners, or any combinations thereof. The signal processing chain may include various analog/RF domain components that may be implemented as an RFIC (e.g., MMIC). Beam controller 210 (e.g., a beamformer) may control beam direction and width of the reception antennas 220, the transmission antennas 225, or both using the phase shifters of the signal processing chain 215 to improve or maintain isolation between various reception and transmission beams. In some cases, the beam controller 210, using the phase shifters, controls beam direction to ensure target reception and transmission beams are sufficiently spread apart to avoid interference. Furthermore, the beam controller 210 may utilize antenna adjustments to adjust beam width, such as certain amplitude and phase offsets to signals carried via the antenna elements of the reception antenna array 220 and the transmission antenna array 225. In some cases, the adjustments associated with the antenna elements may be defined by a beamforming weight set associated to the antenna arrays 220 and 225.

The signal processing chain 215, in some examples, may downconvert received signals from the base station 105 from a received first frequency to an IF signal at a lower second frequency. The IF signal may be filtered to reduce interference from frequencies outside of a frequency window (e.g., frequencies outside of a predefined range of a center frequency of the received signals). In some cases, the filtering may be performed using a filter that is off of the RFIC (e.g., an SAW or BAW filter, separate digital filter, etc.). In other cases, the filtering may be performed by a digital filter that is located on the RFIC.

In some cases, carrier tracking for heterodyning the signals between the first and second frequencies, the beam configurations (e.g., width and direction), as well as gain adjustments may be controlled by the base station 105 via a side control channel. For example, the beam controller 210 may receive control information from remote configuration and local oscillator tracking component 235, which may communicate with base station 105 using non-beamformed communications and a lower frequency antenna 230 (e.g., via an NB-IoT connection using FR1). Additionally or alternatively, control information may be provided by base station 105 via a side channel implemented as a Bluetooth channel, ultra-wide band channel, wireless LAN channel, etc. Accordingly, the repeater 205 may include circuitry for receiving and processing side channel communications to control the beam controller 210. The base station 105 may transmit beamforming control configurations based on operating environment, position of the UE 115, configuration of the UE 115, any detected jammers, or any combinations thereof.

The repeater 205 may receive signals from the base station 105 according to a beamforming configuration and retransmit the signals to the UE 115 according to a beamforming configuration. The repeater 205 may further receive signals from the UE 115 according to a beamforming configuration and retransmit the signals to the base station 105 according to a beamforming configuration. As such, the repeater 205 may function to implement uplink and downlink communications, and the beam controller 210 and signal processing chain 215 be utilized for communication in uplink or downlink scenarios.

Figure 3:
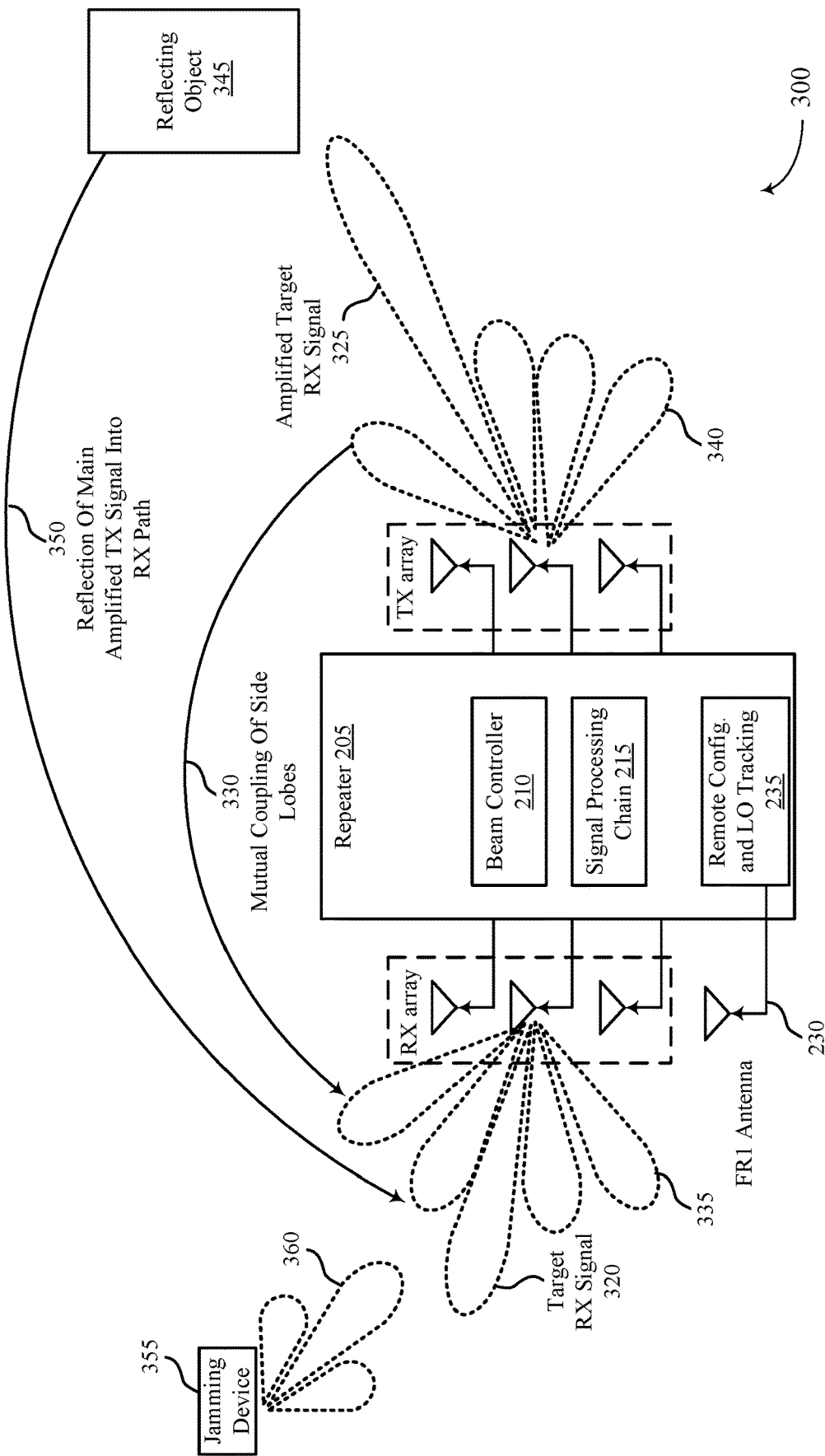
FIG. 3 illustrates an example of another block diagram of a configurable beamforming repeater that supports interference mitigation techniques in directional beamforming repeaters in accordance with aspects of the present disclosure.

FIG. 3 illustrates an example of another block diagram 300 of a configurable beamforming repeater 205 that supports interference mitigation techniques in directional beamforming repeaters in accordance with aspects of the present disclosure. In some examples, the configurable beamforming repeater 205 may implement aspects of wireless communications system 100. The repeater 205 may include a reception antenna array and transmission antenna array as described with respect to FIG. 2. The repeater 205 may beamform the received signal via various beam directions (or scan angles). Lobes (e.g., lobes 320 and 335) illustrate the effective spatial shape of the received signal power after beamforming within the repeater. The lobe 320 (e.g., main lobe) is typically directed to a target reception signal, which may be transmitted by a UE 115 or a base station 105. The target reception signal may correspond to the signal to be retransmitted to another device such as a UE 115 or base station 105. Lobes (e.g., lobes 325 and 340) illustrate the effective spatial shape of a transmitted signal power after beamforming within the repeater. The beam controller 210 may adjust the beam configuration such that the reception antenna array receives a higher quality target signal. In some cases, a jamming device 355 may be present that may have a main lobe 360 and one or more sidelobes that may cause interference with a received signal at repeater 205. In some cases, the signal processing chain 215 may heterodyne a received signal to an IF signal, filter the IF signal to reduce or eliminate interference from the jammer 355, heterodyne the filtered IF signal back to the RF mmWave frequency, and retransmit the signal to a UE.

In some cases, the interfering signals from the jamming device 355 may be present at a different frequency than a frequency of the target reception signal. For example, configurable beamforming repeater 205 may operate in a relatively well-regulated frequency band that prevents concurrent transmissions of devices at the same frequency. However, in some cases, the jamming device 355 may have a significantly higher power than the target reception signal, which may drive one or more receive chains associated with the reception antenna array into gain compression. Further, even though the jamming device 355 may be non-overlapping in frequency with the target reception signal, jamming device 355 may cause the one or more receive chains to generate inter-modulation terms that may overlap with the target reception signals and degrade the SNR ratio. Techniques such as discussed herein may reduce such interference and thereby enhance the SNR of the repeated signal from the configurable beamforming repeater 205.

In some cases, a local oscillator used for heterodyning may be tuned using carrier tracking information from remote configuration and local oscillator tracking component 235, which may be received via a non-beamforming antenna 230. Various examples of local oscillator tuning are discussed in examples of FIGS. 11-15. It should be understood that circuitry for local oscillator generation may be configured in layouts not specifically illustrated in FIGS. 11-15.

In some cases, the beam controller 210 may further adjust the beam configuration of the transmission antenna array such that the target device receives a higher quality signal. In some cases, a transmit or receive beam may be amplified for better reception or retransmission of the target signal. In some cases, the gain, beamforming configuration, or both may be configured based on information from the remote configuration and local oscillator tracking component 235.

Arrow 330 illustrates possible signal reception and retransmission interference via mutual coupling (e.g., signal leakage) of side lobes of the respective beam configurations of the reception antenna array and the transmission antenna array. In some cases, the beam controller 210 may adjust beam width, direction, or both to avoid the mutual coupling. Furthermore, in some cases, the signal processing chain 215 may implement gain control techniques to improve stability and reduce interference in the repeater 205. Arrow 350 illustrates reflection of an amplified signal (e.g., lobe 325) from a reflecting object 345 and to the signal reception beam configuration, which may cause signal interference or leakage. The beam controller 210 may adjust beam width, direction, or both to avoid interference via reflection. As illustrated in FIGS. 5-10, the signal processing chain may include various communication circuitry in various layouts. It should be understood that circuitry of the signal processing chain may be configured in layouts not specifically illustrated in FIGS. 5-10. In some cases, the signal processing chain 215 may be implemented as an RFIC. In some cases, the aspects of this disclosure may be implemented using digital systems and components. In some cases, the meta-material antennas described in FIG. 16 may be used in the circuitry illustrated with respect to FIGS. 5-10. In some cases, when the meta-material antennas are utilized, the circuitry may not include phase shifters and/or feedback paths.

Figure 4:
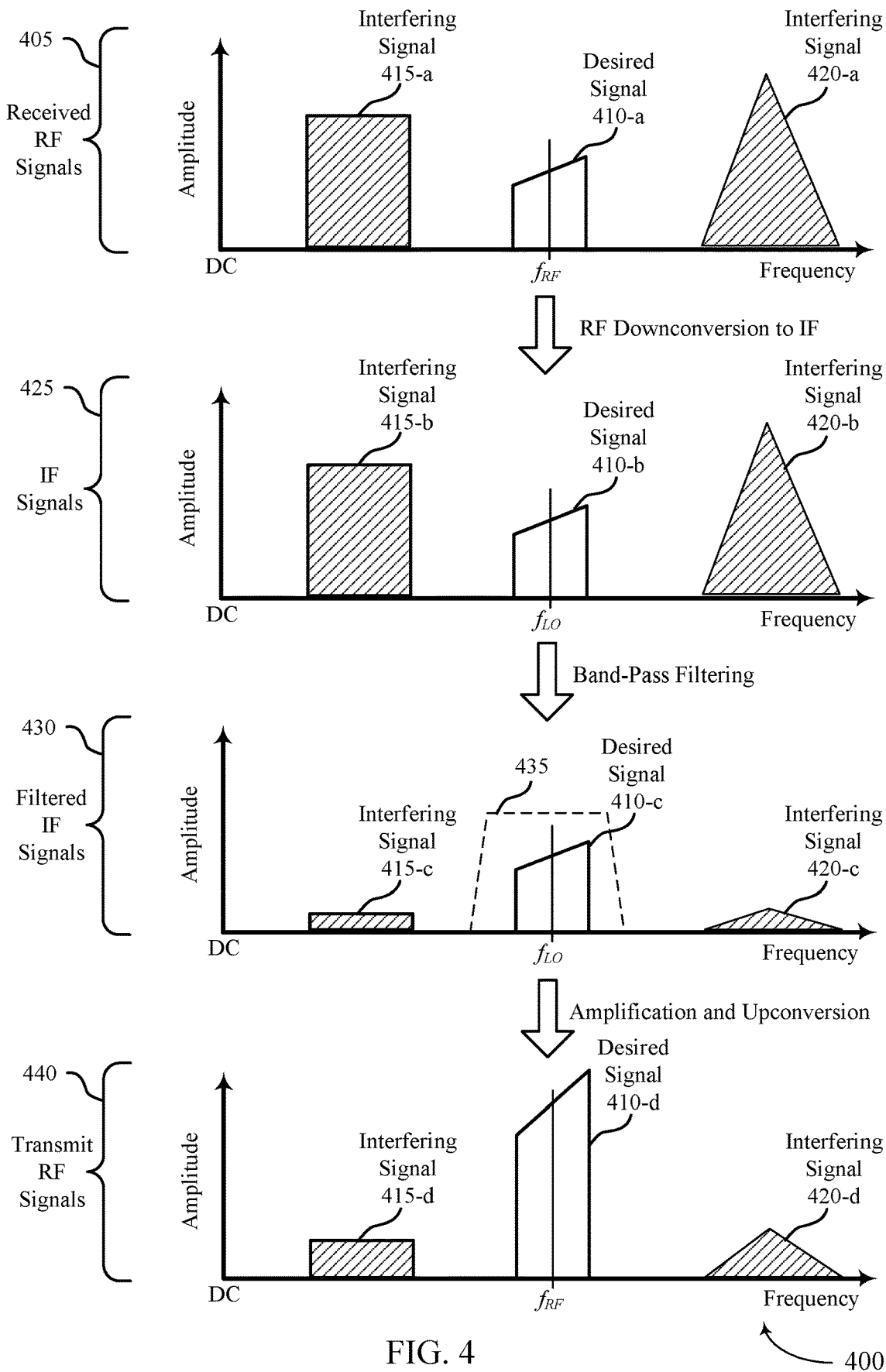
FIG. 4 illustrates an example of a heterodyning and filtering technique that supports interference mitigation techniques in directional beamforming repeaters in accordance with aspects of the present disclosure.

FIG. 4 illustrates an example of a heterodyning and filtering technique 400 that supports interference mitigation techniques in directional beamforming repeaters in accordance with aspects of the present disclosure. In some examples, heterodyning and filtering technique 400 may implement aspects of wireless communications system 100. In this example, a repeater (e.g., a repeater 140 or 205) may receive RF signals 405. The RF signals 405 may be received, for example, from a base station and may be retransmitted to one or more UEs, or may be received from a UE and may be retransmitted to one or more base stations. The received signals may include a desired signal 410-a, having a center frequency of $f_{RF}$, a first interfering signal 415-a, and a second interfering signal 420-a. The interfering signals may be generated from one or more jammers, for example.

The repeater may perform RF downconversion (e.g., by mixing the received RF signals with an output of a local oscillator) to generate IF signals 425, which include an IF representation of the desired signal 410-b having a center frequency of $f_{LO}$, as well as the first interfering signal 415-b and the second interfering signal 420-b. The repeater may then perform filtering on the IF signals 425 to generate filtered IF signals 430. In some cases, the filtering may be band-pass filtering in a frequency window 435 around the center frequency of $f_{LO}$, which largely maintains the amplitude of the desired signal 410-c, and attenuates both the first interfering signal 415-c and the second interfering signal 420-c.

Following the filtering, the repeater may amplify and upconvert the filtered IF signals 430 to generate transmit RF signals 440. In this example, the desired signal 410-d of the transmit RF signals 440 may have a larger amplitude than the transmitted first interfering signal 415-d or transmitted second interfering signal 420-d, which may increase the SNR at a receiving device and may enhance the likelihood of successful reception of the desired signal 410-d at the receiving device.

Figure 5:
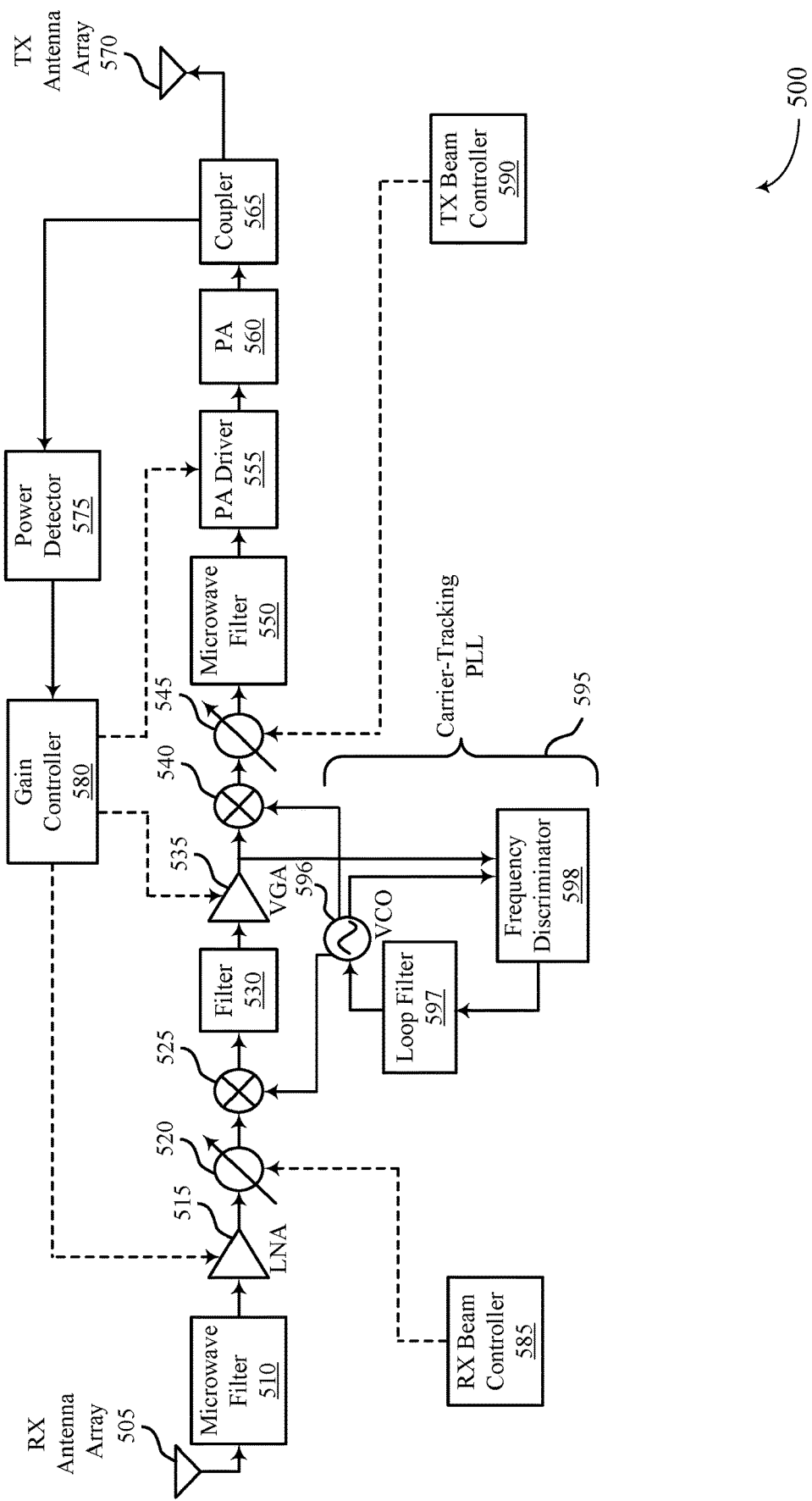
FIG. 5 illustrates an example of a circuit diagram of a signal processing chain that supports interference mitigation techniques in directional beamforming repeaters in accordance with aspects of the present disclosure.

FIG. 5 illustrates an example of a circuit diagram of a signal processing chain 500 that supports interference mitigation techniques in directional beamforming repeaters in accordance with aspects of the present disclosure. In some examples, circuit diagram of a signal processing chain 500 may be implemented in a repeater (e.g., repeater 140 or 205) in aspects of wireless communications system 100. The signal processing chain 500 may include a number of components between a receive antenna array 505 and a transmit antenna array 570, which may include a microwave filter 510 (e.g., which may perform image rejection of microwave signals), LNA 515 component, phase shifter 520 component, a downconversion mixer 525, filter 530 (e.g., a band-pass filter), variable gain amplifier 535, upconversion mixer 540, phase shifter 545, microwave filter 550, PA driver 555, PA 560, and coupler 565. In some cases, phase shifter 520 component and downconversion mixer 525 may be combined into a signal phase-shifting and mixing component. Likewise, upconversion mixer 540 and phase shifter 545 may be combined into a signal phase-shifting and mixing component in some cases.

In this example, feedback may be provided using power detector 575 and gain controller 580. Further, beamforming may be controlled using phase shifters 520 and 545 that may be controlled by reception beam controller 585 and transmission (TX) beam controller 590, respectively. In some cases, components between the reception (RX) antenna array, including antennas 505 and the TX antenna array including antennas 570, may be considered the signal processing chain and may be implemented as an RFIC. In other cases, the filter 530 may be an off-chip filter (e.g., an SAW or BAW) and other components may be implemented as an RFIC. Accordingly, the signal processing chain may include connection points between the antennas 505 and 570, the filter 530, and the components of the signal processing chain.

The receive path for each respective RX antenna 505 may include LNA 515 and phase shifter 520, which may function to pre-process signals received at the RX antenna array, and the pre-processing may result in a plurality of pre-processed instances of the signal. The received signals may be downconverted to an IF at downconversion mixer 525 by mixing the received signal with a signal at a local oscillator (LO) frequency that may be generated by voltage controlled oscillator 596. In this example, a carrier tracking PLL 595 may tune the voltage controlled oscillator (VCO) 596 using frequency discriminator 598 and loop filter 597. In other examples, a free-running LO may be used. Likewise the filtered IF signals may be upconverted back to RF at upconverting mixer 540 by mixing the IF signal with the LO frequency that is generated by voltage controlled oscillator 596.

In some cases, one or more components of signal processing chain 500 may be distributed across multiple antenna elements, pre-processing may be performed at IF or RF, and beamforming may be performed at IF or RF. Several examples of such circuitry configurations as illustrated in FIGS. 6-10, with the understanding that various other implementations for a repeater with heterodyning and filtering may be implemented and are within the scope of the present disclosure.

Figure 6:
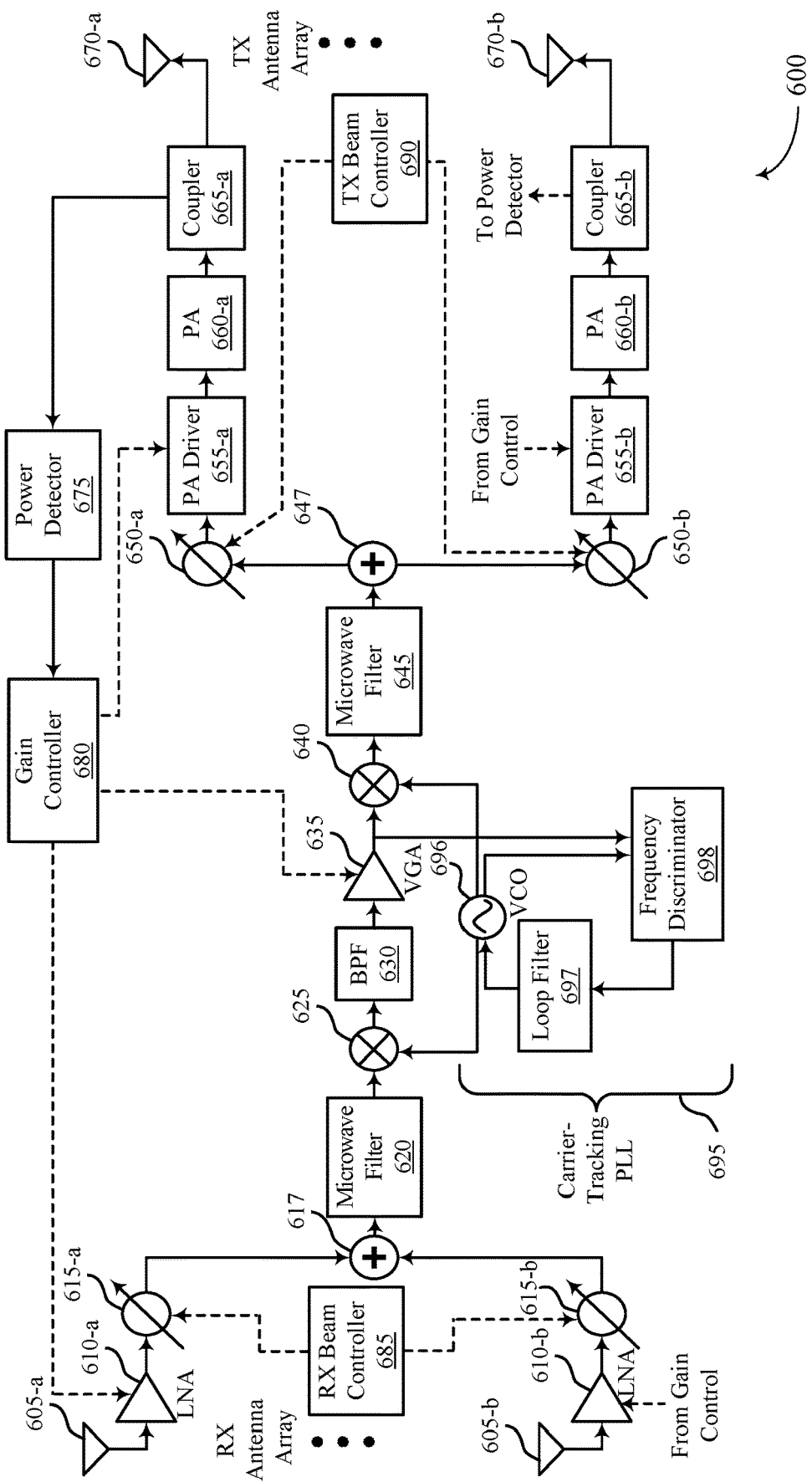
FIG. 6 illustrates an example of a circuit diagram of a signal processing chain that supports interference mitigation techniques in directional beamforming repeaters in accordance with aspects of the present disclosure.

FIG. 6 illustrates an example of a circuit diagram of a signal processing chain 600 that supports interference mitigation techniques in directional beamforming repeaters in accordance with aspects of the present disclosure. In some examples, circuit diagram of a signal processing chain 600 may be implemented in a repeater (e.g., repeater 140 or 205) in aspects of wireless communications system 100. The signal processing chain 600 in this example may have distributed LNAs and PAs, and may include a number of components between a receive antenna array 605 and a transmit antenna array 670. In this example, LNAs 610-*a* and phase shifters 615 may be associated with each antenna element 605 of the receive antenna array. The RX beam controller 685 may adjust phase shifters 615 in accordance with receive beamforming parameters. For example, RX beam controller 685 may provide signals applied to the phase shifter 615-*a* through 615-*b*, associated antennas 605-*a* through 605-*b* may receive a signal, which may be routed to the LNAs 610-*a* through 610-*b*, phase shifters 615-*a* through 615-*b* and to combiner circuit 617 as a pre-processed instance of the signal. The combiner circuit 617, which may be an example of a Wilkinson power combiner or other RF signal combining circuit, combines the pre-processed instances of the signal into a combined signal.

Microwave filter 620 (e.g., which may perform image rejection of microwave signals) may be located after the combiner 617. A downconversion mixer 625, filter 630 (e.g., a band-pass filter), variable gain amplifier 635, upconversion mixer 640, and microwave filter 645 may be located between the combiner 617 and a divider circuit 647. Divider circuit 647, which may be an example of a Wilkinson power divider or other RF signal dividing circuit, divides the output of the microwave filter 645 to a plurality of transmit paths corresponding to the plurality of antennas 670 of the transmit antenna array. Each transmit path may include a phase shifter 650, PA driver 655, PA 660, and a coupler 665. Power detector(s) 675 may be coupled to each of the transmit paths via couplers 665 and monitor the output of the PAs 660 of each transmit path. Based on the monitored output, the gain controller 680 may adjust a gain of one or more of the PA drivers 655, the gain of the LNAs 610, the gain of variable gain amplifier 635, or any combinations thereof. Accordingly, using the PA output, the gain controller 680 may increase or maintain stability of signal transmission within the signal processing chain. The couplers 665 and power detector 675 may comprise respective feedback paths, which may be coupled to the gain controller 680.

In some cases, components between the RX antenna array including antennas 605 and the TX antenna array including antennas 670 may be considered the signal processing chain and may be implemented as an RFIC, as discussed with respect to FIG. 5. The received signals may be downconverted to an IF at downconversion mixer 625 by mixing the received signal with a signal at an LO frequency that is generated by voltage controlled oscillator 696. In this example, a carrier tracking PLL 695 may tune the VCO 696 using frequency discriminator 698 and loop filter 697. In other examples, a free-running LO may be used. Likewise the filtered IF signals may be upconverted back to RF at upconversion mixer 640 by mixing the IF signal with the LO frequency that is generated by voltage controlled oscillator 696.

Figure 7:
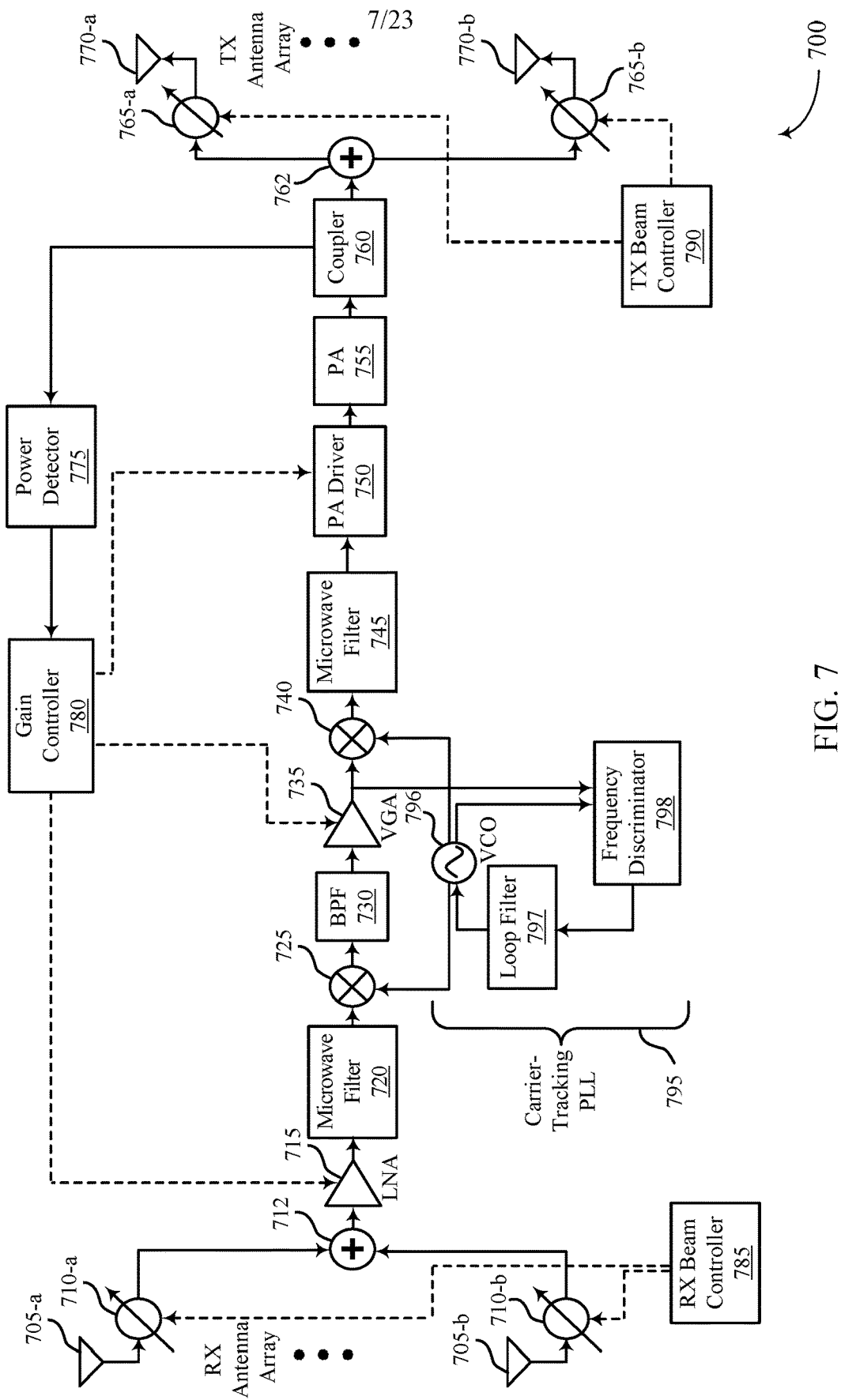
FIG. 7 illustrates an example of a circuit diagram of a signal processing chain that supports interference mitigation techniques in directional beamforming repeaters in accordance with aspects of the present disclosure.

FIG. 7 illustrates an example of a circuit diagram of a signal processing chain 700 that supports interference mitigation techniques in directional beamforming repeaters in accordance with aspects of the present disclosure. In some examples, circuit diagram of a signal processing chain 700 may be implemented in a repeater (e.g., repeater 140 or 205) in aspects of wireless communications system 100. The signal processing chain 700 in this example may have a single LNA for received signals and a single PA for retransmitted signals, and may include a number of components between a receive antenna array 705 and a transmit antenna array 770. In this example, phase shifters 710 may be associated with each antenna element 705 of the receive antenna array. The RX beam controller 785 may adjust phase shifters 710 in accordance with receive beamforming parameters. For example, RX beam controller 785 may provide signals applied to the phase shifter 710-*a* through 710-*b*, and associated antennas 705-*a* through 705-*b* may receive a signal which may be routed to the phase shifters 710-*a* through 710-*b* and to combiner circuit 712 as a pre-processed instance of the signal. The combiner circuit 712, which may be an example of a Wilkinson power combiner or other RF signal combining circuit, combines the pre-processed instances of the signal into a combined signal. In this case, LNA 715 is located after the combiner circuit 712

Microwave filter 720 (e.g., which may perform image rejection of microwave signals) may be located after the LNA 715. A downconversion mixer 725, filter 730 (e.g., a band-pass filter), variable gain amplifier 735, upconversion mixer 740, microwave filter 745, PA driver 750, PA 755, and coupler 760 may be located between the combiner 717 and a divider circuit 762. Divider circuit 762, which may be an example of a Wilkinson power divider or other RF signal dividing circuit, divides the output of the coupler 760 to a plurality of transmit paths corresponding to the plurality of antennas 770 of the transmit antenna array. Each transmit path may include a phase shifter 765, in this example. Power detector 775 may be coupled to the transmit path via coupler 760 and monitors the output of the PA 755. Based on the monitored output, the gain controller 780 may adjust a gain of one or more of the PA driver 750, the gain of the LNA 715, the gain of variable gain amplifier 735, or any combinations thereof. Accordingly, using the PA output, the gain controller 780 may increase or maintain stability of signal transmission within the signal processing chain. The coupler 760 and power detector 775 may include respective feedback paths, which may be coupled to the gain controller 780.

In some cases, components between the RX antenna array, including antennas 705 and the TX antenna array including antennas 770, may be considered the signal processing chain and may be implemented as an RFIC, as similarly discussed with respect to FIG. 5. The received signals may be downconverted to an IF at downconversion mixer 725 by mixing the received signal with a signal at an LO frequency that may be generated by voltage controlled oscillator 796. In this example, a carrier tracking PLL 795 may tune the VCO 796 using frequency discriminator 798 and loop filter 797. In other examples, a free-running LO may be used. Likewise the filtered IF signals may be upconverted back to RF at upconversion mixer 740 by mixing the IF signal with the LO frequency that may be generated by voltage controlled oscillator 796.

Figure 8:
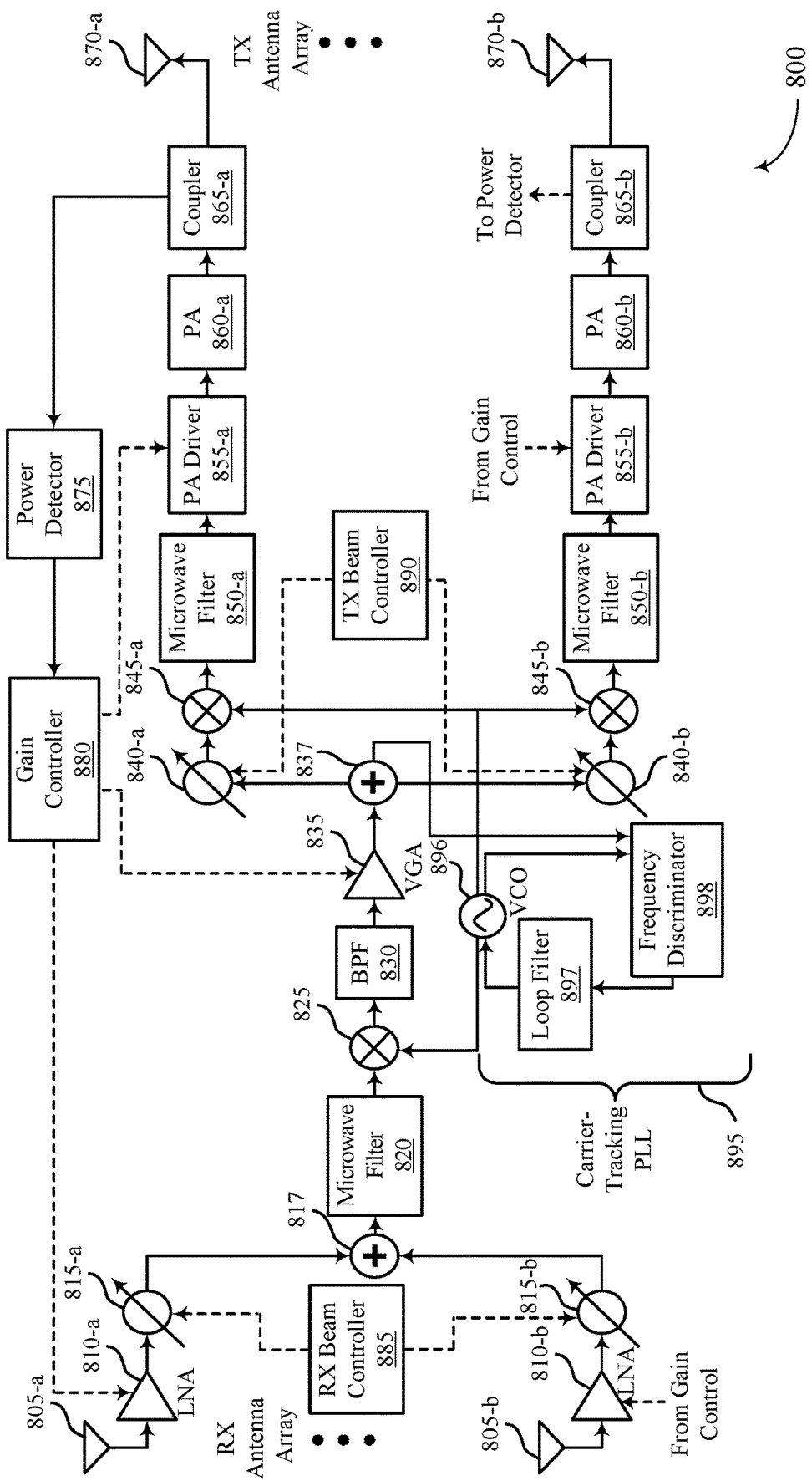
FIG. 8 illustrates an example of a circuit diagram of a signal processing chain that supports interference mitigation techniques in directional beamforming repeaters in accordance with aspects of the present disclosure.

FIG. 8 illustrates an example of a circuit diagram of a signal processing chain 800 that supports interference mitigation techniques in directional beamforming repeaters in accordance with aspects of the present disclosure. In some examples, circuit diagram of a signal processing chain 800 may be implemented in a repeater (e.g., repeater 140 or 205) in aspects of wireless communications system 100. The signal processing chain 800 in this example performs transmit beamforming at IF, and performs receive beamforming at RF. Signal processing chain may include a number of components between a receive antenna array 805 and a transmit antenna array 870. In this example, LNAs 810 and phase shifters 815 may be associated with each antenna element 805 of the receive antenna array 805. The RX beam controller 885 may adjust phase shifters 815 in accordance with receive beamforming parameters. For example, RX beam controller 885 may provide signals applied to the phase shifter 815-a through 815-b, and associated antennas 805-a through 805-b may receive a signal which may be routed to the LNAs 810-a through 810-b and phase shifters 815-a through 815-b and to combiner circuit 817 as a pre-processed instance of the signal. The combiner circuit 817, which may be an example of a Wilkinson power combiner or other RF signal combining circuit, may combine the pre-processed instances of the signal into a combined signal.

Microwave filter 820 (e.g., which may perform image rejection of microwave signals) may be located after the LNA 815. A downconversion mixer 825, filter 830 (e.g., a BPF), and variable gain amplifier 835, may be located between the combiner 817 and a divider circuit 837. Divider circuit 837, which may be an example of a Wilkinson power divider or other RF signal dividing circuit, may divide the output of the variable gain amplifier 835 to a plurality of transmit paths corresponding to the plurality of antennas 870 of the transmit antenna array. Each transmit path may include a phase shifter 840 an upconversion mixer 845, a microwave filter 850, a PA driver 855, a PA 860, and a coupler 865. Power detector 875 may be coupled to each transmit path via coupler 865 and may monitor the output of the PAs 860. Based on the monitored output, the gain controller 880 may adjust a gain of one or more of the PA drivers 855, the gain of the LNA 810, the gain of variable gain amplifier 835, or any combinations thereof. Accordingly, using the PA output, the gain controller 880 may increase or maintain stability of signal transmission within the signal processing chain. The couplers 865 and power detector 875 may include respective feedback paths, which are coupled to the gain controller 880.

In some cases, components between the RX antenna array including antennas 805 and the TX antenna array including antennas 870 may be considered the signal processing chain and may be implemented as an RFIC, as discussed with respect to FIG. 5. The received signals may be downconverted to an IF at downconversion mixer 825 by mixing the received signal with a signal at an LO frequency that may be generated by voltage controlled oscillator 896. In this example, a carrier tracking PLL 895 may tune the VCO 896 using frequency discriminator 898 and loop filter 897. In other examples, a free-running LO may be used. Likewise the filtered IF signals may be upconverted back to RF at upconversion mixers 845 by mixing the IF signal with the LO frequency that may be generated by voltage controlled oscillator 896.

Figure 9:
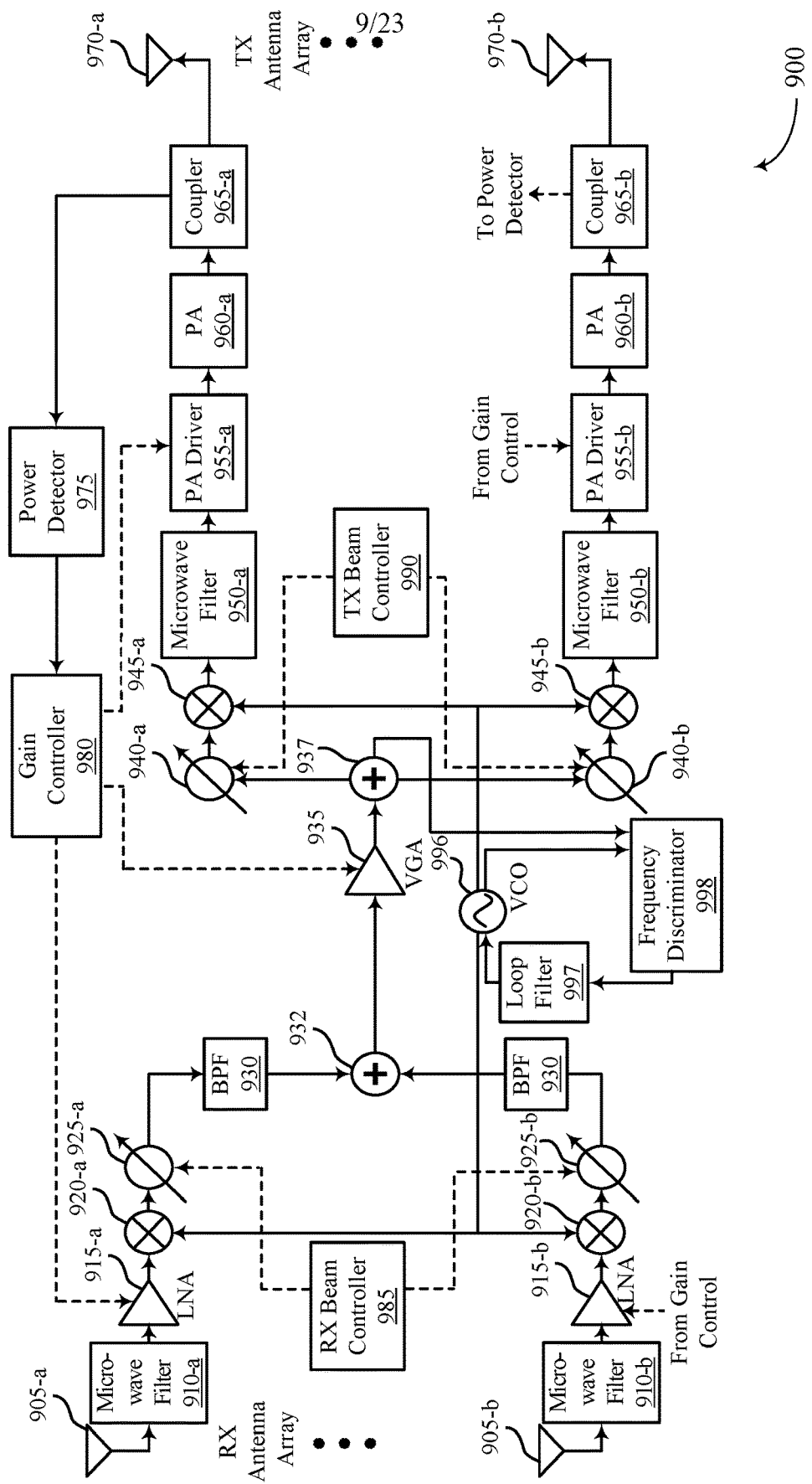
FIG. 9 illustrates an example of a circuit diagram of a signal processing chain that supports interference mitigation techniques in directional beamforming repeaters in accordance with aspects of the present disclosure.

FIG. 9 illustrates an example of a circuit diagram of a signal processing chain 900 that supports interference mitigation techniques in directional beamforming repeaters in accordance with aspects of the present disclosure. In some examples, circuit diagram of a signal processing chain 900 may be implemented in a repeater (e.g., repeater 140 or 205) in aspects of wireless communications system 100. The signal processing chain 900 in this example performs transmit beamforming and receive beamforming at IF. Signal processing chain includes a number of components between a receive antenna array 905 and a transmit antenna array 970. In this example, microwave filters 910, LNAs 915, downconverting mixers 920, phase shifters 925, and BPF 930 may be in a receive path associated with each antenna element 905 of the receive antenna array. The RX beam controller 985 may adjust phase shifters 925 in accordance with receive beamforming parameters. For example, RX beam controller 985 may provide signals applied to the phase shifter 925-a through 925-b. Associated antennas 905-a through 905-b may receive a signal which may be routed to the microwave filters 910-a through 910-b and LNAs 915-a through 915-b, with each then being downconverted to IF at downconverting mixers 920-a through 920-b, and beamforming at phase shifters 925-a through 925-b may be performed at IF. The phase shifted signals may be filtered at BPFs 930, and the filtered IF signals may be provided to combiner circuit 932. The combiner circuit 932, which may be an example of a Wilkinson power combiner or other RF signal combining circuit, combines the instances of the filtered IF signal into a combined signal.

In this example, the combined filtered IF signal may be provided to variable gain amplifier 935 that may be located between the combiner 932 and a divider circuit 937. Divider circuit 937, which may be an example of a Wilkinson power divider or other RF signal dividing circuit, divides the output of the variable gain amplifier 935 to a plurality of transmit paths corresponding to the plurality of antennas 970 of the transmit antenna array. Each transmit path may include a phase shifter 940 an upconversion mixer 945, a microwave filter 950, a PA driver 955, a PA 960, and a coupler 965. Power detector 975 may be coupled to each transmit path via coupler 965 and monitors the output of the PAs 960. Based on the monitored output, the gain controller 980 may adjust a gain of one or more of the PA drivers 955, the gain of the LNAS 915, the gain of variable gain amplifier 935, or any combinations thereof. Accordingly, using the PA output, the gain controller 980 may increase or maintain stability of signal transmission within the signal processing chain. The couplers 965 and power detector 975 may include respective feedback paths, which are coupled to the gain controller 980.

In some cases, components between the RX antenna array including antennas 905 and the TX antenna array including antennas 970 may be considered the signal processing chain and may be implemented as an RFIC, similarly as discussed with respect to FIG. 5. The received signals may be downconverted to an IF at downconverting mixers 920 by mixing the received signal with a signal at an LO frequency that may be generated by voltage controlled oscillator 996. In this example, a carrier tracking PLL 995 may tune the VCO 996 using frequency discriminator 998 and loop filter 997. In other examples, a free-running LO may be used. Likewise the filtered IF signals may be upconverted back to RF at upconversion mixers 945 by mixing the IF signal with the LO frequency that may be generated by voltage controlled oscillator 996.

Figure 10:
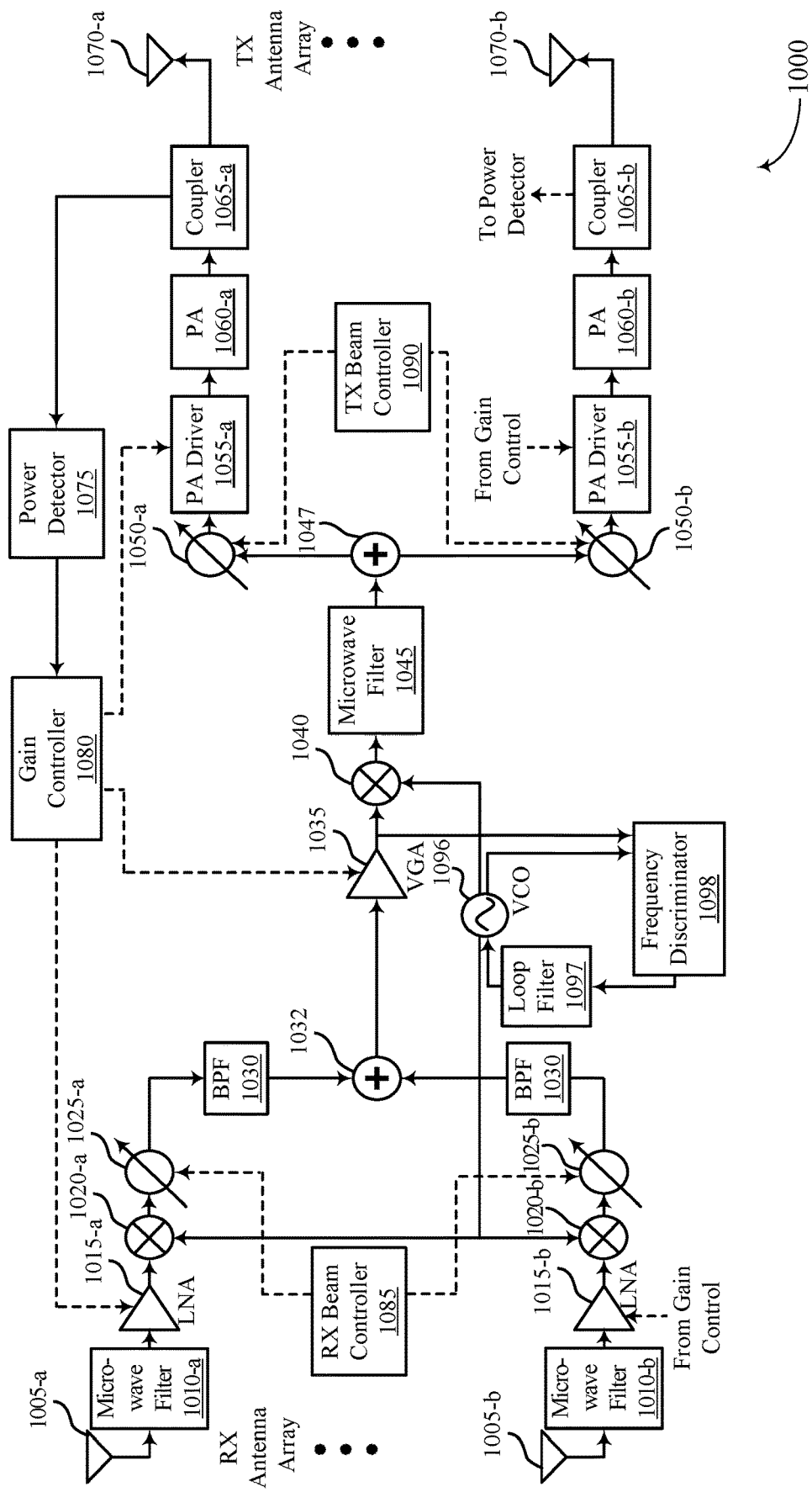
FIG. 10 illustrates an example of a circuit diagram of a signal processing chain that supports interference mitigation techniques in directional beamforming repeaters in accordance with aspects of the present disclosure.

FIG. 10 illustrates an example of a circuit diagram of a signal processing chain 1000 that supports interference mitigation techniques in directional beamforming repeaters in accordance with aspects of the present disclosure. In some examples, circuit diagram of a signal processing chain 1000 may be implemented in a repeater (e.g., repeater 140 or 205) in aspects of wireless communications system 100. The signal processing chain 1000 in this example performs transmit beamforming at RF, and performs receive beamforming at IF. Signal processing chain includes a number of components between a receive antenna array 1005 and a transmit antenna array 1070. In this example, microwave filters 1010, LNAs 1015, downconverting mixers 1020, phase shifters 1025, and BPFs 1030 may be in a receive path associated with each antenna element 1005 of the receive antenna array. The RX beam controller 1085 may adjust phase shifters 1025 in accordance with receive beamforming parameters. For example, RX beam controller 1085 may provide signals applied to the phase shifter 1025-a through 1025-b, and associated antennas 1005-a through 1005-b may receive a signal which may be routed to the microwave filters 1010-a through 1010-b and LNAs 1015-a through 1015-b, with each then being downconverted to IF at downconverting mixers 1020-a through 1020-b, and beamforming at phase shifters 1025-a through 1025-b may be performed at IF. The phase shifted signals may be filtered at BPFs 1030, and the filtered IF signals may be provided to combiner circuit 1032. The combiner circuit 1032, which may be an example of a Wilkinson power combiner or other RF signal combining circuit, combines the instances of the filtered IF signal into a combined signal.

In this example, the combined filtered IF signal may be provided to variable gain amplifier 1035, which may amplify the filtered IF signal, and upconverting mixer 1040 may upconvert the IF signal back to RF and provide the signal to a microwave filter 1045. Divider circuit 1047, which may be an example of a Wilkinson power divider or other RF signal dividing circuit, divides the output of the microwave filter 1045 to a plurality of transmit paths corresponding to the plurality of antennas 1070 of the transmit antenna array. Each transmit path may include a phase shifter 1050, a PA driver 1055, a PA 1060, and a coupler 1065. Power detector 1075 may be coupled to each transmit path via coupler 1065 and monitors the output of the PAs 1060. Based on the monitored output, the gain controller 1080 may adjust a gain of one or more of the PA drivers 1055, the gain of the LNAS 1015, the gain of variable gain amplifier 1035, or any combinations thereof. Accordingly, using the PA output, the gain controller 1080 may increase or maintain stability of signal transmission within the signal processing chain. The couplers 1065 and power detector 1075 may include respective feedback paths, which are coupled to the gain controller 1080.

In some cases, components between the RX antenna array including antennas 1005 and the TX antenna array including antennas 1070 may be considered the signal processing chain and may be implemented as an RFIC, similarly as discussed with respect to FIG. 5. The received signals may be downconverted to an IF at downconverting mixers 1020 by mixing the received signal with a signal at an LO frequency that may be generated by voltage controlled oscillator 1096. In this example, a carrier tracking PLL 1095 may tune the VCO 1096 using frequency discriminator 1098 and loop filter 1097. In other examples, a free-running LO may be used. Likewise the filtered IF signals may be upconverted back to RF at upconverting mixer 1040 by mixing the IF signal with the LO frequency that may be generated by voltage controlled oscillator 1096.

Figure 11:
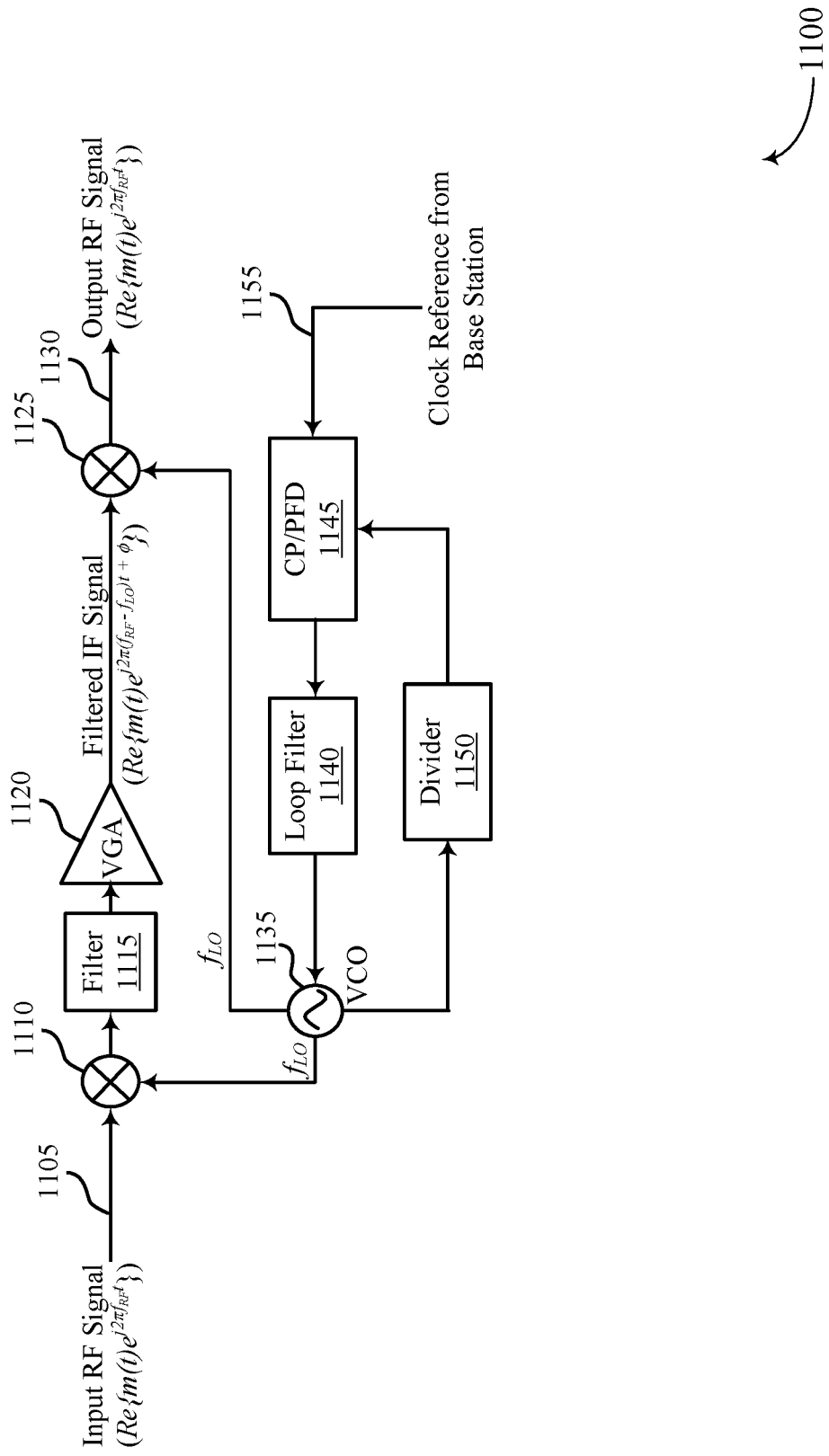
FIG. 11 illustrates an example of a circuit diagram of a carrier tracking component that supports interference mitigation techniques in directional beamforming repeaters in accordance with aspects of the present disclosure.

FIG. 11 illustrates an example of a circuit diagram of a carrier tracking component 1100 that supports interference mitigation techniques in directional beamforming repeaters in accordance with aspects of the present disclosure. In some examples, circuit diagram of a carrier tracking component 1100 may implement aspects of wireless communications system 100 or repeaters 140 or 205. As indicated above, in some cases carrier tracking may be used to tune the output of a VCO 1135 used for mixing to generate IF and RF signals. In the example of FIG. 11, an input signal 1105 may be received at downconverting mixer 1110. The input signal 1105 may be represented, in some cases, as $\text{Re}\{m(t)e^{j2\pi f_{RF}t}\}$, where fir is the center frequency of the received RF signal. The IF signal output of the downconverting mixer 1110 may be provided to a filter 1115 (e.g., an SAW, BAW, or digital filter that may be located on a same integrated circuit as other components or off the integrated circuit). A variable gain amplifier (VGA) 1120 may amplify the filtered IF signal in order to amplify the signal of interest after interfering signals are attenuated at the filter 1115. In some cases, the filtered IF signal may be represented as $\text{Re}\{m(t)e^{j2\pi(f_{RF}-f_{LO})t+\Theta}\}$, where $f_{LO}$ is the output frequency of VCO 1135. The filtered IF signal may be provided to upconverting mixer 1125 to generate output RF signal 1130. In some cases, the output RF signal 1130 may be represented as $\text{Re}\{m(t)e^{j2\pi f_{RF}t}\}$.

In this example, the output of the VCO 1135 may be tuned based on a clock reference 1155 provided by the base station. In some cases, the clock reference 1155 may be determined based on a non-beamformed connection with the base station, from which the repeater may determine a local oscillator frequency of the base station used to generate the input RF signal 1105. For example, the clock reference 1155 may be determined based on a previously established control link with the base station that may be already carrier-frequency at lower frequency, and may thus be used for tracking of the input RF signal 1105 frequency. The clock reference 1155 may be provided to a charge-pump/phase frequency detector (CP/PFD) 1145, which may include a digital circuit that uses sequential logic to detect phase or frequency differences between the clock reference 1155 and a divider 1150 output. A loop filter 1140 may receive the output of the CP/PFD 1145 and adjust an output provided to the VCO 1135 based on a magnitude of the phase or frequency differences between the clock reference 1155 and a divider 1150 output. In some cases, an RF or crystal clock reference of the repeater may be used as the frequency input to the VCO 1135 to generate $f_{LO}$. While the example of FIG. 11 shows an integer synthesizer (an integer divider 1150), such a circuit could also be a fractional synthesizer.

Figure 12:
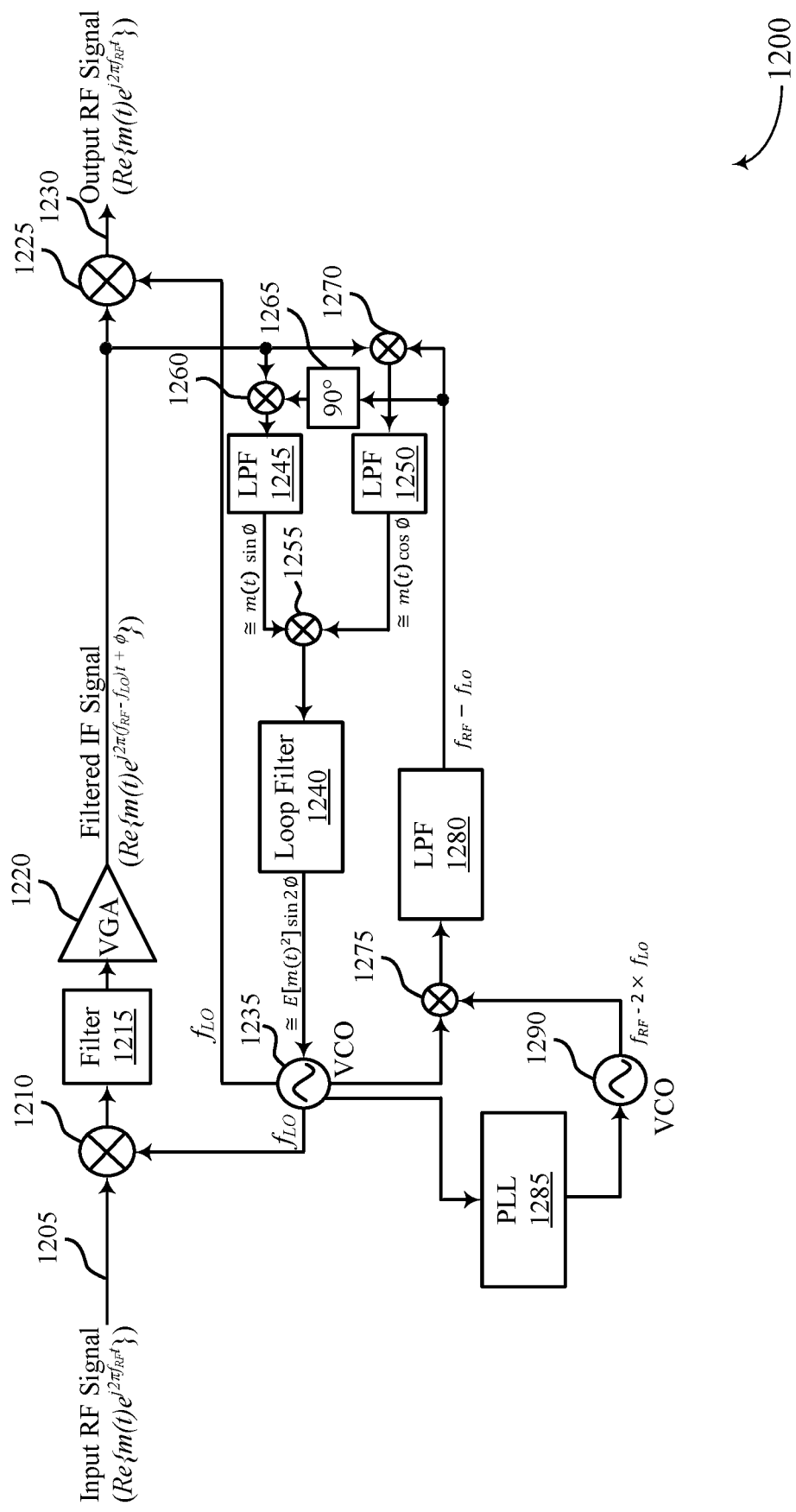
FIG. 12 illustrates an example of a circuit diagram of a carrier tracking component that supports interference mitigation techniques in directional beamforming repeaters in accordance with aspects of the present disclosure.

FIG. 12 illustrates an example of a circuit diagram of a carrier tracking component 1200 that supports interference mitigation techniques in directional beamforming repeaters in accordance with aspects of the present disclosure. In some examples, circuit diagram of a carrier tracking component 1200 may implement aspects of wireless communications system 100 or repeaters 140 or 205. In this example, carrier tracking may use a Costas PLL to tune the output of a VCO used for mixing to generate IF and RF signals. In the example of FIG. 12, an input signal 1205 may be received at downconverting mixer 1210. The input signal 1205 may be represented, in some cases, as $\text{Re}\{m(t)e^{j2\pi f_{RF}t}\}$, where $f_{RF}$ is the center frequency of the received RF signal. The IF signal output of the downconverting mixer 1210 may be provided to a filter 1215 (e.g., an SAW, BAW, or digital filter that may be located on a same integrated circuit as other components or off the integrated circuit). A VGA 1220 may amplify the filtered IF signal in order to amplify the signal of interest after interfering signals are attenuated at the filter 1215. In some cases, the filtered IF signal may be represented as $\text{Re}\{m(t)e^{j2\pi(f_{RF}-f_{LO})t+\varnothing}\}$, where $f_{LO}$ is the output frequency of VCO 1235. The filtered IF signal may be provided to upconverting mixer 1225 to generate output RF signal 1230. In some cases, the output RF signal 1230 may be represented as $\text{Re}\{m(t)e^{j2\pi f_{RF}t}\}$.

In this example, the output of the VCO 1235 may be tuned based on a Costas loop PLL. In this case, VCO 1235 output may be provided to PLL 1285 VCO 1290 to generate a signal $f_{RF}-2(f_{LO})$ that may be mixed at mixer 1275 with the output of VCO 1235 and provided to low pass filter 1280 to generate a reference $f_{RF}-f_{LO}$. The output of the low pass filter 1280 may mixed at mixer 1270 with the filtered IF signal and provided to low pass filter 1250. The output of the low pass filter 1280 may also be phase-shifted by 90 degrees at phase shifter 1265, mixed at mixer 1270 with the filtered IF signal, and provided to low pass filter 1245. The outputs of low pass filter 1245 and low pass filter 1250 may be mixed at mixer 1255 and provided to loop filter 1240 to generate an adjustment to the VCO 1235, which may be represented as $=E[m(t)^2]\sin 2\varnothing$. Such an implementation may provide carrier tracking, in some cases, when $E[m(t)^2]$ is constant or slowly varying relative to drift, and $\varnothing$ is small, such that the VCO is tuned by $2\varnothing$. In some cases, in order to provide reliable carrier tracking, the gain control in such cases would need to be converged and frequency error relatively small. In some cases, in order to provide for initial acquisition, a base station may transmit binary phase-shift key (BPSK) or quadrature phase-shift key (QPSK) signals for synchronization signal block transmissions, which provide that $E[m(t)^2]=1$, and may allow the carrier tracking to converge.

Figure 13:
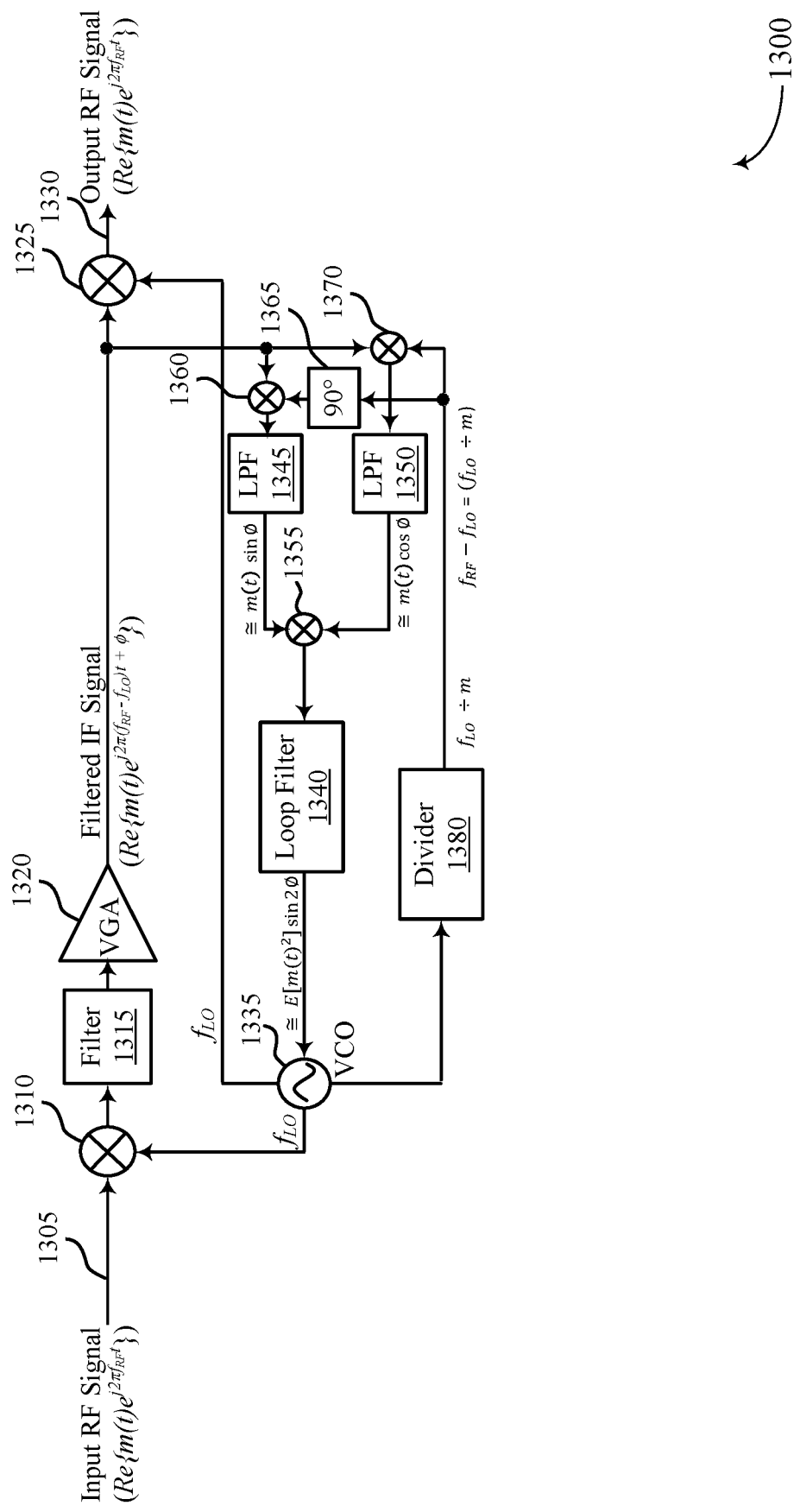
FIG. 13 illustrates an example of a circuit diagram of a carrier tracking component that supports interference mitigation techniques in directional beamforming repeaters in accordance with aspects of the present disclosure.

FIG. 13 illustrates an example of a circuit diagram of a carrier tracking component 1300 that supports interference mitigation techniques in directional beamforming repeaters in accordance with aspects of the present disclosure. In some examples, circuit diagram of a carrier tracking component 1300 may implement aspects of wireless communications system 100 or repeaters 140 or 205. In this example, carrier tracking may use a Costas PLL with a frequency divider to tune the output of a VCO used for mixing to generate IF and RF signals. In the example of FIG. 13, an input signal 1305 may be received at downconverting mixer 1310. The input signal 1305 may be represented, in some cases, as $\text{Re}\{m(t)e^{j2\pi f_{RF}t}\}$, where $f_{RF}$ is the center frequency of the received RF signal. The IF signal output of the downconverting mixer 1310 may be provided to a filter 1315 (e.g., an SAW, BAW, or digital filter that may be located on a similar, or the same, integrated circuit as other components or off the integrated circuit). A VGA 1320 may amplify the filtered IF signal in order to amplify the signal of interest after interfering signals are attenuated at the filter 1315. In some cases, the filtered IF signal may be represented as $\text{Re}\{m(t)e^{j2\pi(f_{RF}-f_{LO})t+\varnothing}\}$, where $f_{LO}$ is the output frequency of VCO 1335. The filtered IF signal may be provided to upconverting mixer 1325 to generate output RF signal 1330. In some cases, the output RF signal 1330 may be represented as $\text{Re}\{m(t)e^{j2\pi f_{RF}t}\}$.

In this example, the output of the VCO 1335 may be tuned based on a Costas loop PLL, similarly as discussed with respect to FIG. 12, but with a frequency divider 1380 used to generate $f_{RF}-f_{LO}$. In this case, the output of the frequency divider 1380 may mixed at mixer 1370 with the filtered IF signal and provided to low pass filter 1350. The output of the divider 1380 may also be phase-shifted by 90 degrees at phase shifter 1365, mixed at mixer 1370 with the filtered IF signal, and provided to low pass filter 1345. The outputs of low pass filter 1345 and low pass filter 1350 may be mixed at mixer 1355 and provided to loop filter 1340 to generate an adjustment to the VCO 1335, which may be represented as $\cong E[m(t)^2]\sin 2\varnothing$. Such an implementation may provide less complex frequency generation that may work with frequencies of $f_{LO}$ that have a relationship with $f_{RF}$ such that the divider output provides $f_{RF}-f_{LO}$. Similarly as discussed with reference to FIG. 12, in order to provide for initial acquisition, a base station may transmit BPSK or QPSK signals for synchronization signal block transmissions, which provide that $E[m(t)^2]=1$, and may allow the carrier tracking to converge.

Figure 14:
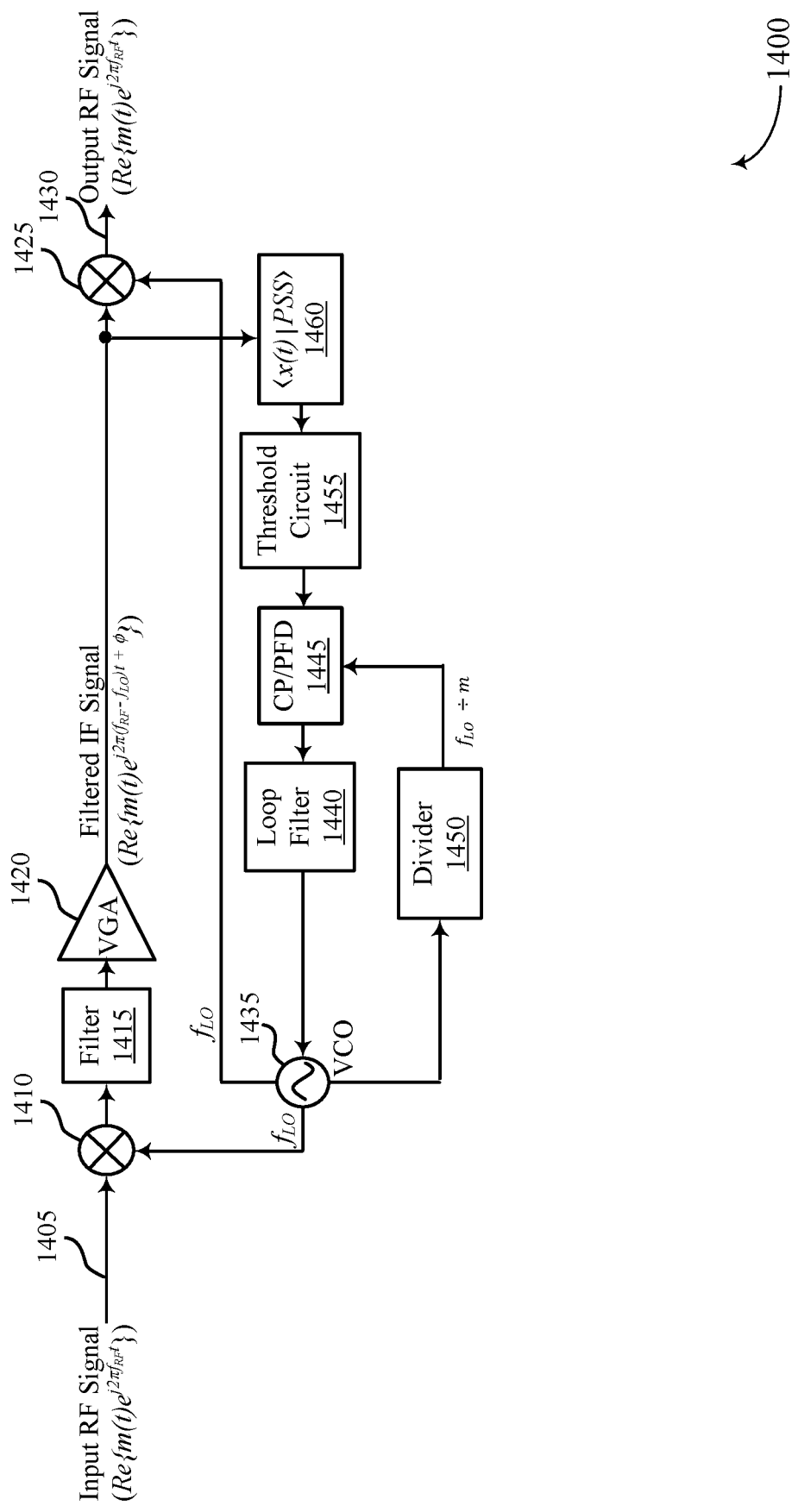
FIG. 14 illustrates an example of a circuit diagram of a carrier tracking component that supports interference mitigation techniques in directional beamforming repeaters in accordance with aspects of the present disclosure.

FIG. 14 illustrates an example of a circuit diagram of a carrier tracking component 1400 that supports interference mitigation techniques in directional beamforming repeaters in accordance with aspects of the present disclosure. In some examples, circuit diagram of a carrier tracking component 1400 may implement aspects of wireless communications system 100 or repeaters 140 or 205. In this example, carrier tracking may use blind carrier tracking via analog cross-correlation with a primary synchronization sequence (PSS) to tune the output of a VCO used for mixing to generate IF and RF signals. In the example of FIG. 14, an input signal 1405 may be received at downconverting mixer 1410. The input signal 1405 may be represented, in some cases, as $\text{Re}\{m(t)e^{j2\pi f_{RF}t}\}$ where $f_{RF}$ is the center frequency of the received RF signal. The IF signal output of the downconverting mixer 1410 may be provided to a filter 1415 (e.g., an SAW, BAW, or digital filter that may be located on a same integrated circuit as other components or off the integrated circuit). A VGA 1420 may amplify the filtered IF signal in order to amplify the signal of interest after interfering signals are attenuated at the filter 1415. In some cases, the filtered IF signal may be represented as $\text{Re}\{m(t)e^{j2\pi(f_{RF}-f_{LO})t+\varnothing}\}$, where $f_{LO}$ is the output frequency of VCO 1435. The filtered IF signal may be provided to upconverting mixer 1425 to generate output RF signal 1430. In some cases, the output RF signal 1430 may be represented as $\text{Re}\{m(t)e^{j2\pi f_{RF}t}\}$.

In this example, the output of the VCO 1435 may be tuned based on a timing error from analog cross-correlator 1460. In some cases, a PSS of the base station may be transmitted using a BPSK, and analog cross-correlation of the BPSK signal with an RF source or crystal may be used to indicate timing error. The output of the analog cross-correlator 1460 may be provided to threshold circuit 1455, which may determine if the analog cross-correlation exceeds a threshold value. Further, in this example, the output of VCO 1435 may be provided to divider 1450 which may divide by m, to generate $f_{LO}/m$. In this case, the output of the divider 1450 and the output of the threshold circuit 1455 may be provided to CP/PFD 1445, which may include a digital circuit that uses sequential logic to detect phase or frequency differences between the analog cross-correlation and the divided frequency. A loop filter 1440 may receive the output of the CP/PFD 1445 and adjust an output provided to the VCO 1435.

Figure 15:
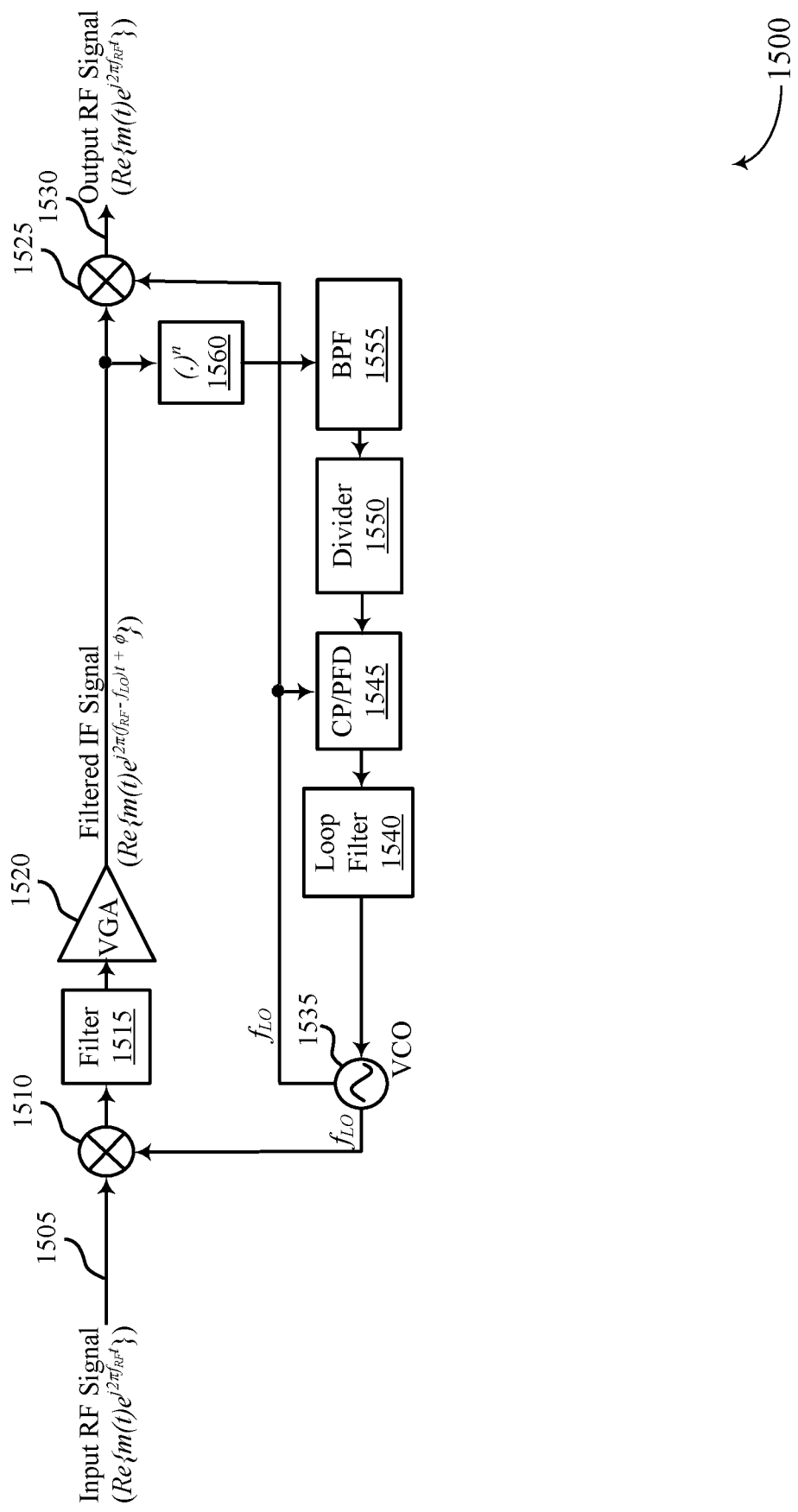
FIG. 15 illustrates an example of a circuit diagram of a carrier tracking component that supports interference mitigation techniques in directional beamforming repeaters in accordance with aspects of the present disclosure.

FIG. 15 illustrates an example of a circuit diagram of a carrier tracking component 1500 that supports interference mitigation techniques in directional beamforming repeaters in accordance with aspects of the present disclosure. In some examples, circuit diagram of a carrier tracking component 1500 may implement aspects of wireless communications system 100 or repeaters 140 or 205. In this example, carrier tracking may use blind carrier tracking via frequency discriminator and PLL for sliding IF heterodyne to tune the output of a VCO used for mixing to generate IF and RF signals. In the example of FIG. 15, an input signal 1505 may be received at downconverting mixer 1510. The input signal 1505 may be represented, in some cases, as Re $\{m(t)e^{j2\pi f_{RF}t}\}$ where $f_{RF}$ is the center frequency of the received RF signal. The IF signal output of the downconverting mixer 1510 may be provided to a filter 1515 (e.g., an SAW, BAW, or digital filter that may be located on a same integrated circuit as other components or off the integrated circuit). A VGA 1520 may amplify the filtered IF signal in order to amplify the signal of interest after interfering signals are attenuated at the filter 1515. In some cases, the filtered IF signal may be represented as Re$\{m(t)e^{j2\pi(f_{RF}-f_{LO})t+\Theta}\}$, where $f_{LO}$ is the output frequency of VCO 1535. The filtered IF signal may be provided to upconverting mixer 1525 to generate output RF signal 1530. In some cases, the output RF signal 1530 may be represented as Re$\{m(t)e^{j2\pi f_{RF}t}\}$.

In this example, the output of the VCO 1535 may be tuned based on blind carrier tracking via a frequency discriminator and PLL. Such an implementation may provide a nonlinearity 1560 that may be applied to the filtered IF signal, with an output of the non-linearity provided to a BPF 1555. The output of the BPF 1555 may be provided to divider 1550, which may divide the received output by an integer value associated with a value of the non-linearity. For example, the value of $f_{LO}$ may be selected to be an integer sub-multiple of $f_{RF}$ (e.g., $f_{RF}=n\times f_{LO}$) and the BPF 1555 may extract the desired multiple of $f_{LO}$, which may then be provided to divider 1550 for division by the desired multiple. In this case, the output of the divider 1550 and the VCO 1535 output may be provided to CP/PFD 1545, which may include a digital circuit that uses sequential logic to detect phase or frequency differences between the inputs. A loop filter 1540 may receive the output of the CP/PFD 1545 and adjust an output provided to the VCO 1535.

Figure 16:
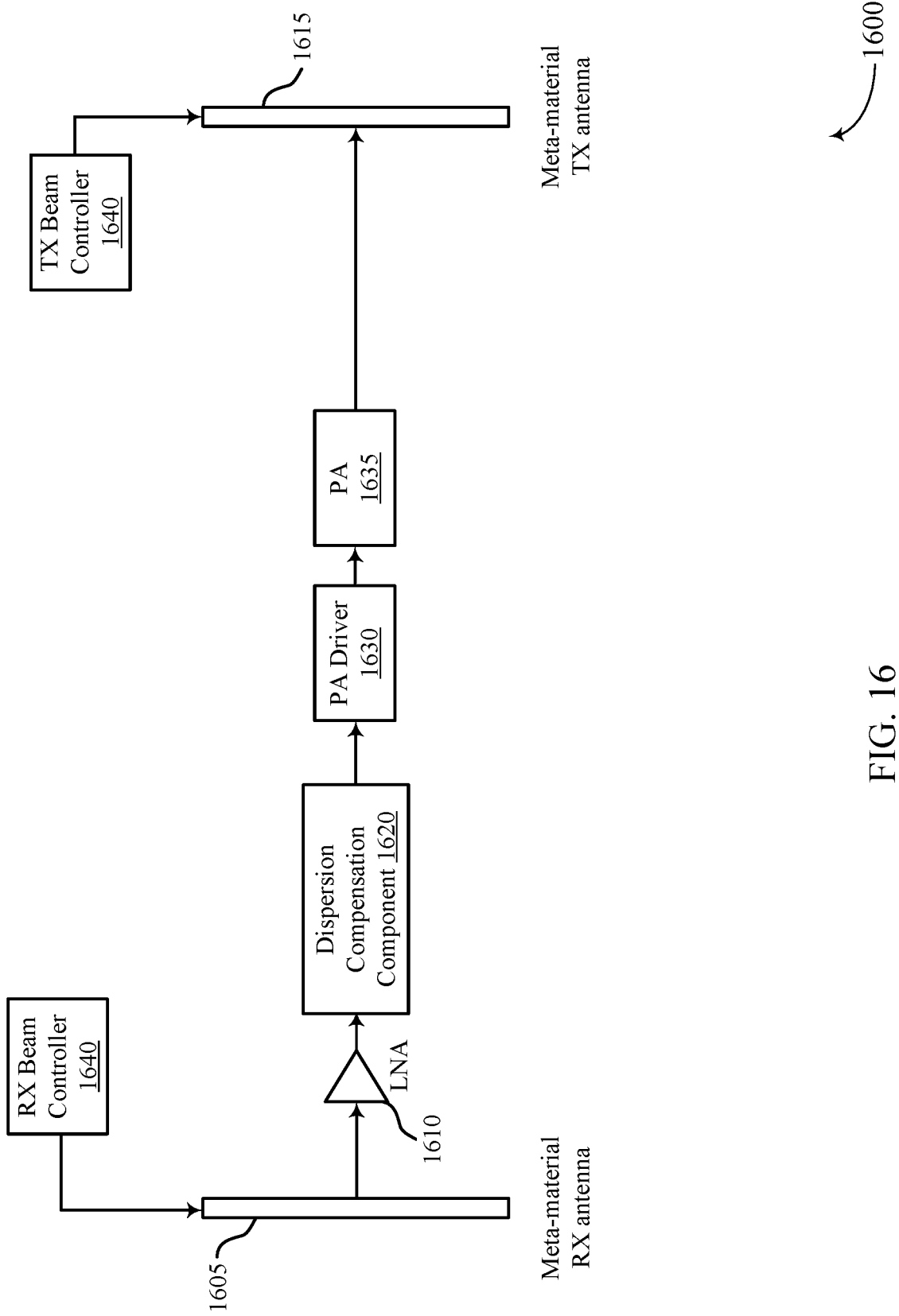
FIG. 16 illustrates an example of a circuit diagram of a signal processing chain using meta-material antennas that supports interference mitigation techniques in directional beamforming repeaters in accordance with aspects of the present disclosure.

FIG. 16 illustrates an example of a circuit diagram of a signal processing chain using meta-material antennas 1600 that supports interference mitigation techniques in directional beamforming repeaters in accordance with aspects of the present disclosure. In some examples, circuit diagram of a signal processing chain using meta-material antennas 1600 may implement aspects of wireless communications system 100. In this example, the various components, including transmission lines, LNA 1610, dispersion compensation component 1620, PA driver 1630, PA 1635, reception beam controller 1640, and transmission beam controller 1640 between meta-material RX antenna 1605 and meta-material TX antenna 1615 may be considered the signal processing chain and may be implemented as an RFIC. Accordingly, the signal processing chain may include connection points between the antennas 1605 and 1615 and the components of the signal processing chain.

The meta-material RX antenna 1605 and the meta-material TX antenna 1615 may exhibit negative permittivity and/or permeability, which may yield a negative refractive index. Hence, the antennas may produce a lens capability, which may assist in beamforming. The refractive index of the antennas 1605 and 1615 may be electrically tuned for controlling the beam configuration (e.g., width, direction, angle) by the respective controllers 1640 and 1645. In some cases, the antennas 1605 and 1615 may include an array of meta-material antennas, which may allow reduced spacing (e.g., less than λ/2).

Based on RX beam controller 1640 signals applied to the meta-material RX antenna (or meta-material antenna array), the antenna 1605-$a$ may receive a signal (e.g., based on beam configuration), which may be routed to the LNA 1610. Similarly, based on RX beam controller 1645 signals applied to the meta-material TX antenna 1615 (or meta-material antenna array) the antenna 1615 may transmit a signal according to a beam configuration If the antennas 1605 and/or 1615 include meta-material antennas configured in an array, the circuit may include a combiner circuit, as described herein to combine pre-processed instances of the signal into a combined signal, and/or a divider circuit to divide the signal to transmit paths corresponding to each meta-material antenna of the meta-material antenna array. The signal processing chain includes the LNA 1610, dispersion compensation component 1620, and the PA 1635. The dispersion compensation component 1620 may correct the distortion introduced by the meta-material antenna using an RF or analog circuit. In some cases, the signal processing chain may also include a feedback path, similarly as discussed above.

Such meta-materials may be any material of tunable electrical permittivity and/or magnetic permeability, and may be manufactured, for example, using nano-fabrication methods. In some cases, one or more components in an RF chain can be designed with meta-materials, including antennas, switches, phase-shifters, wave-guides, couplers, filters/resonators, oscillators, duplexers/circulators, or any combinations thereof. In some cases, the material refractive index may be a function of permittivity and permeability (e.g., based on Snell's law, from Maxwell's equations). Such materials may be designed for negative permittivity and/or permeability, and hence, have a negative refractive index. In some cases, meta-materials may also be referred to as left-handed materials, Epsilon negative (ENG) materials, double-negative materials, negative refractive index, or Chiral materials. Some use cases of meta-materials may include electrically small antennas (smaller than λ/10) that retain high efficiency and bandwidth, radio-transparent antennas to allow antenna stacking, limit scatter and mutual coupling, phase-shifters implemented by tuning the dielectric of wave-guides, non-magnetic circulators for duplexing, and the like. Such materials may provide a relatively low insertion loss, may be designed for circuits from sub-6 GHz to several terahertz (THz), and exhibit low power consumption. In some cases, meta-materials may be used to provide super-resolution lenses that operate below the diffraction limit.

Figure 17:
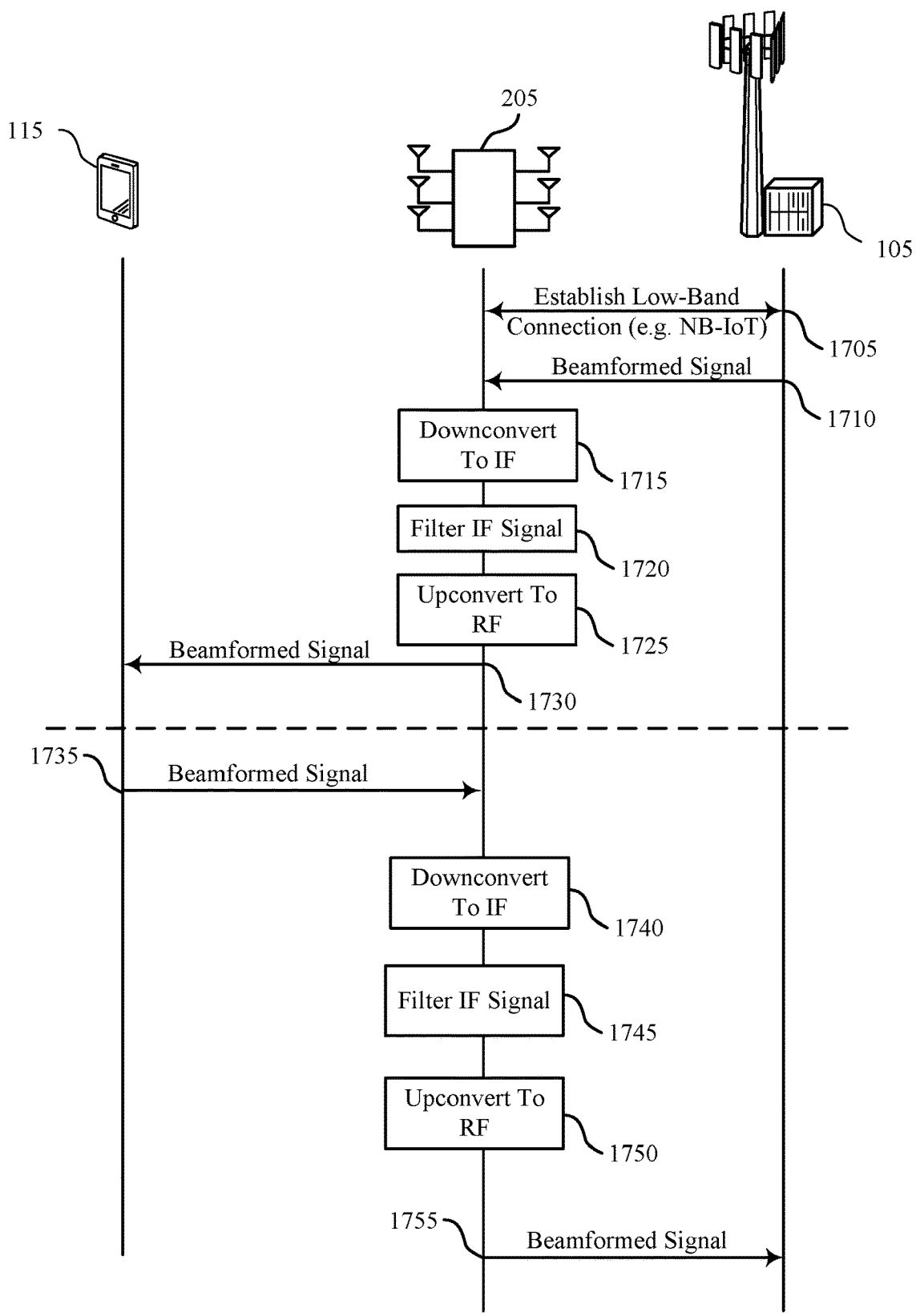
FIG. 17 illustrates an example of a process flow that supports interference mitigation techniques in directional beamforming repeaters in accordance with aspects of the present disclosure.

FIG. 17 illustrates an example of a process flow 1700 that supports interference mitigation techniques in directional beamforming repeaters in accordance with aspects of the present disclosure. In some examples, process flow 1700 may implement aspects of wireless communications system 100. The process flow includes UE 115, repeater 205, and base station 105. It should be understood that the features of process flow 1700 may be implemented in uplink and downlink scenarios.

At 1705, base station 105 and repeater 205 may establish a low-band connection. In some cases, the low-band connection may be a side connection that may be used to provide control information regarding beamforming to the repeater. Additionally or alternatively, the low-band connection may provide carrier tracking information that may be used to tune a VCO used for generating $f_{LO}$ at the repeater 205. In some cases, the repeater 205 may, additionally or alternatively, establish a low-band connection with UE 115. In some cases, the low-band connection may be a NB-IoT connection using NB-IoT protocols.

At 1710, the base station may transmit a beamformed signal to the repeater 205, which may be received at the repeater 205 via directional beamforming at a first antenna array. The receiver side beamforming may be configured by a beam controller of the repeater 205. At 1715, the repeater 205 may downconvert the beamformed signal to an IF signal. In some cases, the downconverting may be performed by mixing the received signal with a local oscillator output generated at the repeater 205.

At 1720, the repeater 205 may filter the IF signal to attenuate undesired frequency components in the IF signal. In some cases, a BPF about a center frequency of the IF may be used, and frequencies outside of the BPF may be attenuated. At 1725, the repeater 250 may upconvert the filtered IF signal to RF. The upconversion may be performed by mixing the IF signal with the local oscillator output. At 1730, the repeater 205 retransmits the signal via directional beamforming at a second antenna array of the repeater 205 to the UE 115. The angle or direction may be configured by a beam controller of the repeater. The signal processing at repeater 205 may be performed using circuits and techniques as described with respect to FIGS. 2-16.

The repeater 205 may also perform repeating for uplink signals from the UE 115 to the base station 105. For example, at 1735, the UE 115 transmits a signal to the repeater 205, and the repeater 205 receives the signal from the UE 115 via directional beamforming at the second antenna array. At 1740, the repeater 205 may downconvert the beamformed signal to an IF signal. In some cases, the downconverting may be performed by mixing the received signal with a local oscillator output generated at the repeater 205.

At 1745, the repeater 205 may filter the IF signal to attenuate undesired frequency components in the IF signal. In some cases, a BPF about a center frequency of the IF may be used, and frequencies outside of the BPF may be attenuated. At 1750, the repeater 250 may upconvert the filtered IF signal to RF. The upconversion may be performed by mixing the IF signal with the local oscillator output. At 1755, the repeater 205 retransmits the signal via directional beamforming at the first antenna array of the repeater 205 to the base station 105. The angle or direction may be configured by a beam controller of the repeater. Again, the signal processing at repeater 205 may be performed using circuits and techniques as described with respect to FIGS. 2-16.

Figure 18:
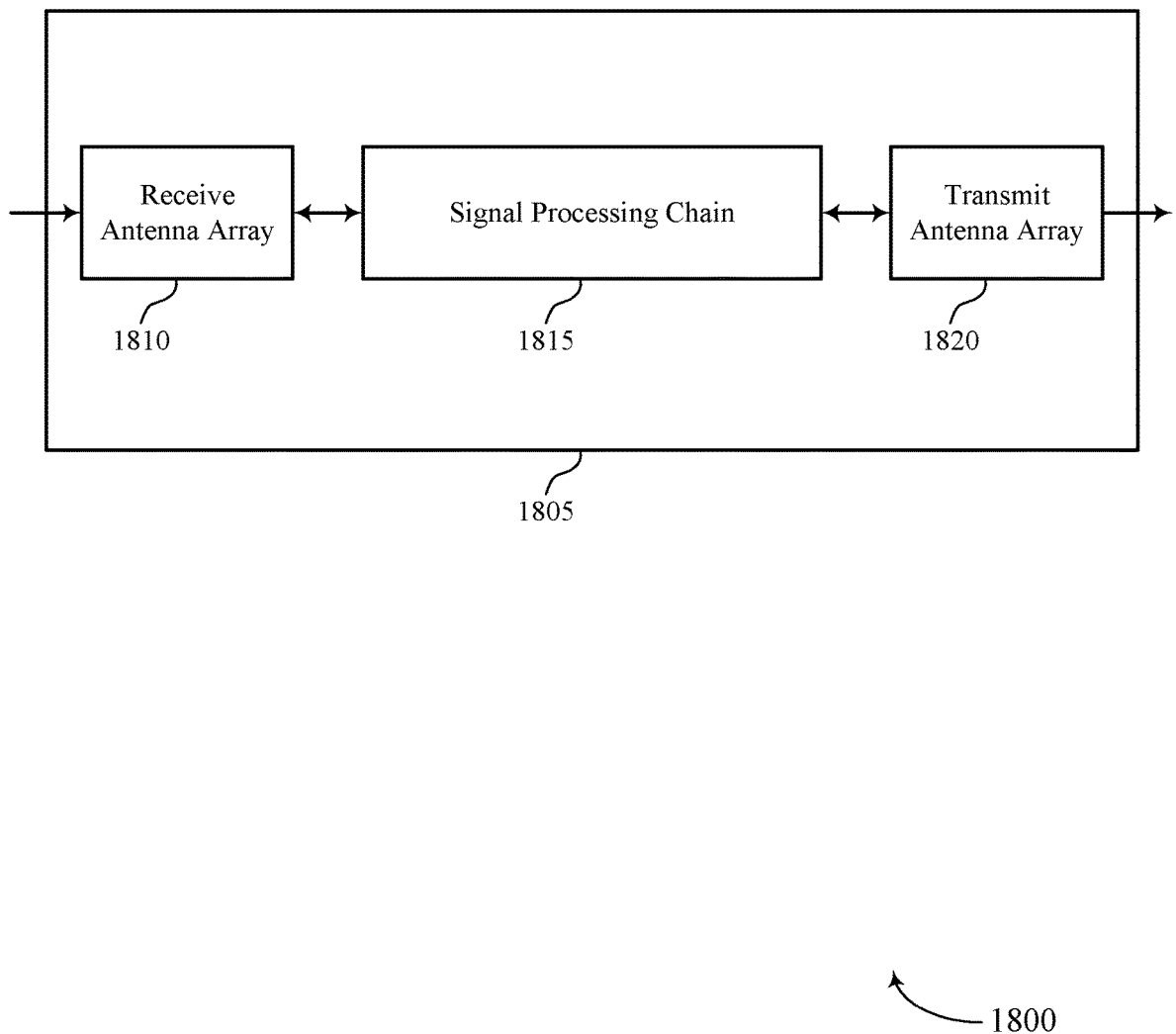
FIG. 18 shows a block diagram of a device that supports interference mitigation techniques in directional beamforming repeaters in accordance with aspects of the present disclosure.

FIG. 18 illustrates an example of a block diagram 1800 of a device 1805 that supports interference mitigation techniques in directional beamforming repeaters in accordance with aspects of the present disclosure. The device 1805 may be an example of aspects of a repeater, UE 115, or a base station 105 as described herein. The device 1805 may include a receiving antenna array 1810, a signal processing chain 1815, and a transmitting antenna array 1820. The device 1805 may also include a processor. Each of these components may be in communication with one another (e.g., via one or more buses).

The receiving antenna array 1810 may receive RF signals and these signals may be passed on to other components of the device 1805. The receiving antenna array 1810 may utilize a set of antennas. The signal processing chain 1815, or its sub-components, may be implemented in hardware, and may include RF/microwave components, such as amplifiers, dividers and combiners. These may be implemented as part of an RF circuit with transistors. Examples of such RF circuits may include MMICs.

The signal processing chain 1815, or its sub-components, may be physically located at various positions, including being distributed such that portions of functions are implemented at different physical locations by one or more physical components. In some examples, the signal processing chain 1815, or its sub-components, may be a separate and distinct component in accordance with various aspects of the present disclosure. In some examples, the signal processing chain 1815, or its sub-components, may be combined with one or more other hardware components. The signal processing chain may include circuitry as discussed with respect to FIGS. 5-16.

The transmitting antenna array 1820 may transmit signals generated by other components of the device 1805. In some examples, the transmitting antenna array 1820 may be collocated with a receiving antenna array 1810. The transmitting antenna array 1820 may utilize set of antennas.

Figure 19:
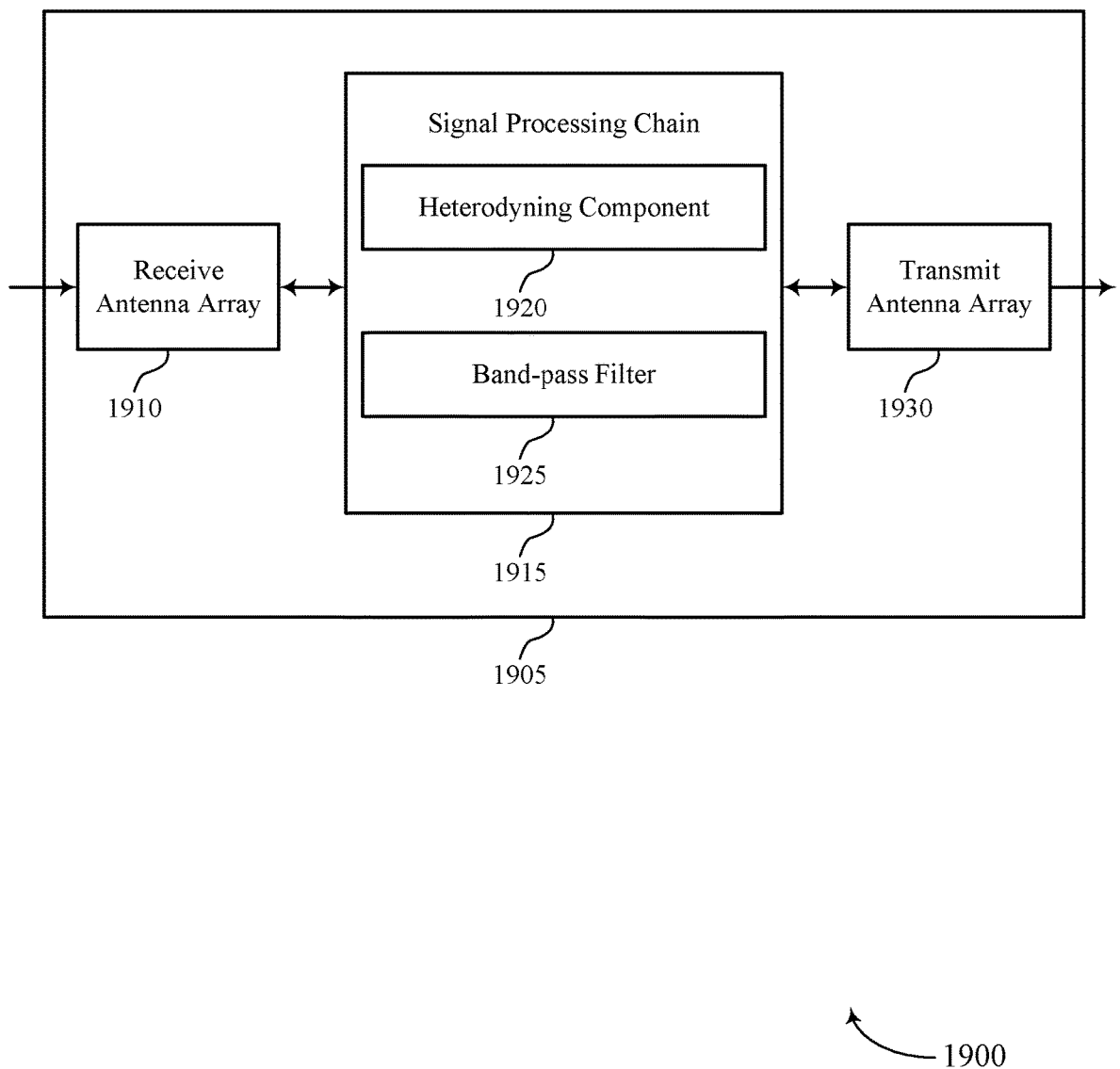
FIG. 19 shows a block diagram of a repeater that supports interference mitigation techniques in directional beamforming repeaters in accordance with aspects of the present disclosure.

FIG. 19 illustrates an example of a block diagram 1900 of a device 1905 of a configurable beamforming repeater in accordance with aspects of the present disclosure. The device 1905 may be an example of aspects of a device 1805, a base station, or a UE as described herein. The device 1905 may include a receiving antenna array 1910, a signal processing chain 1915, and a transmitting antenna array 1930.

The receiving antenna array 1910 may receive RF signals and these signals may be passed on to other components of the device 1905. The receiving antenna array 1910 may utilize set of antennas. In some cases, the receiving antenna array 1910 includes a meta-material antenna or antenna array.

The signal processing chain 1915 may be an example of aspects of the signal processing chain 1815 as described herein. The signal processing chain 1915 may include a heterodyning component 1920, and a BPF 1925. The signal processing chain 1915 may receive, at a first antenna array (e.g., the receiving antenna array 1910), a signal via directional beamforming and retransmit the signal via directional beamforming at a second antenna array (e.g., the transmitting antenna array 1930) of the wireless repeater. The heterodyning component 1920 may downconvert the received signal to an IF signal, and may upconvert the IF signal to an RF signal for retransmission. The BPF may filter the IF signal to remove one or more interfering signals.

The actions performed by the signal processing chain 1915 as described herein may be implemented to realize one or more potential advantages. One implementation may enable a mmWave beamforming repeater to receive a signal from a base station using beamforming, filtering, and gain control techniques. Such techniques may improve signal quality between the base station and a UE, which may result in higher data rates and more efficient communications (e.g., less communication errors), among other advantages.

Based on implementing the techniques as described herein, a processor of a UE or base station (e.g., a processor controlling the receiving antenna array 1910, the signal processing chain 1915, the transmitting antenna array 1930, or a combination thereof) may enhance signaling reliability in a communications system, while ensuring relatively efficient communications. For example, the beamforming, filtering, and gain control techniques described herein may leverage mmWave communications, which may include relatively narrow beams, using repeaters, which may realize improved spectral efficiency and power savings, among other benefits.

The transmitting antenna array 1930 may transmit signals generated by other components of the device 1905. In some examples, the transmitting antenna array 1930 may be collocated with a receiving antenna array 1910 in a transceiver. The transmitting antenna array 1930 may utilize a set of antennas. In some cases, the transmitting antenna array 1930 includes a meta-material antenna or antenna array.

Figure 20:
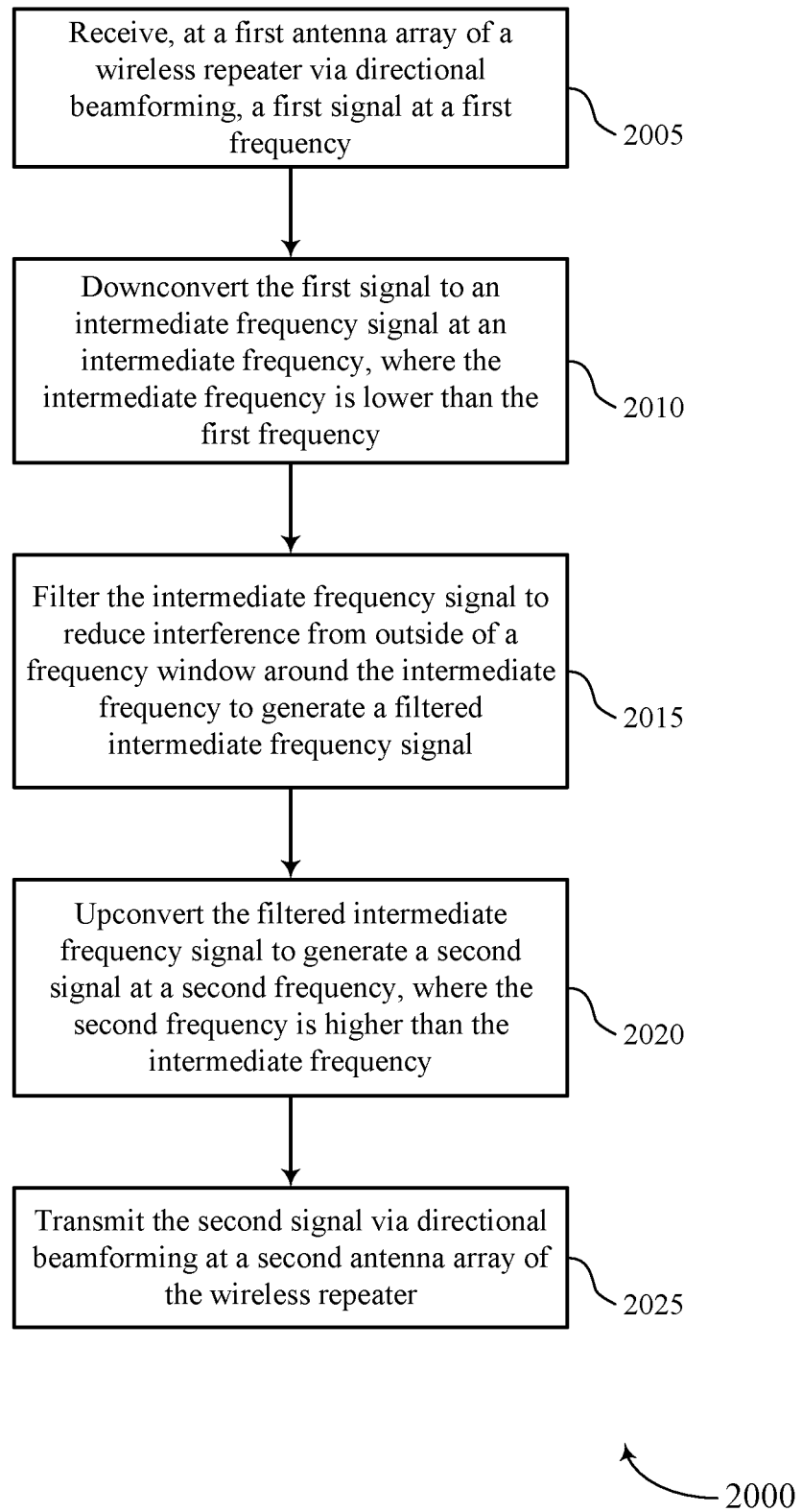
FIGS. 20-23 show flowcharts illustrating methods that support interference mitigation techniques in directional beamforming repeaters in accordance with aspects of the present disclosure.

FIG. 20 shows a flowchart illustrating a method 2000 that supports interference mitigation techniques in directional beamforming repeaters in accordance with aspects of the present disclosure. The operations of method 2000 may be implemented by a wireless device or its components as described herein. For example, the operations of method 2000 may be performed by a repeater as described with reference to FIGS. 5-19. In some examples, a wireless device may execute a set of instructions to control the functional elements of the wireless device to perform the functions described herein. Additionally or alternatively, a wireless device may perform aspects of the functions described herein using special-purpose hardware.

At 2005, the wireless device may receive, at a first antenna array of a wireless repeater via directional beamforming, a first signal at a first frequency. The operations of 2005 may be performed according to the methods described herein. In some examples, aspects of the operations of 2005 may be performed by a receive array as described with reference to FIGS. 5-10.

At 2010, the wireless device may downconvert the first signal to an IF signal at an IF, where the IF may be lower than the first frequency. The operations of 2010 may be performed according to the methods described herein. In some examples, aspects of the operations of 2010 may be performed by a heterodyning component such as a mixer as described with reference to FIGS. 5-16, and 19.

At 2015, the wireless device may filter the IF signal to reduce interference from outside of a frequency window around the IF to generate a filtered IF signal. The operations of 2015 may be performed according to the methods described herein. In some examples, aspects of the operations of 2015 may be performed by a BPF as described with reference to FIGS. 5-16.

At 2020, the wireless device may upconvert the filtered IF signal to generate a second signal at a second frequency, where the second frequency may be higher than the IF. The operations of 2020 may be performed according to the methods described herein. In some examples, aspects of the operations of 2020 may be performed by a heterodyning component, such as a mixer, as described with reference to FIGS. 5-16, and 19.

At 2025, the wireless device may transmit the second signal via directional beamforming at a second antenna array of the wireless repeater. The operations of 2025 may be performed according to the methods described herein. In some examples, aspects of the operations of 2025 may be performed by a transmit array as described with reference to FIGS. 5-10.

Figure 21:
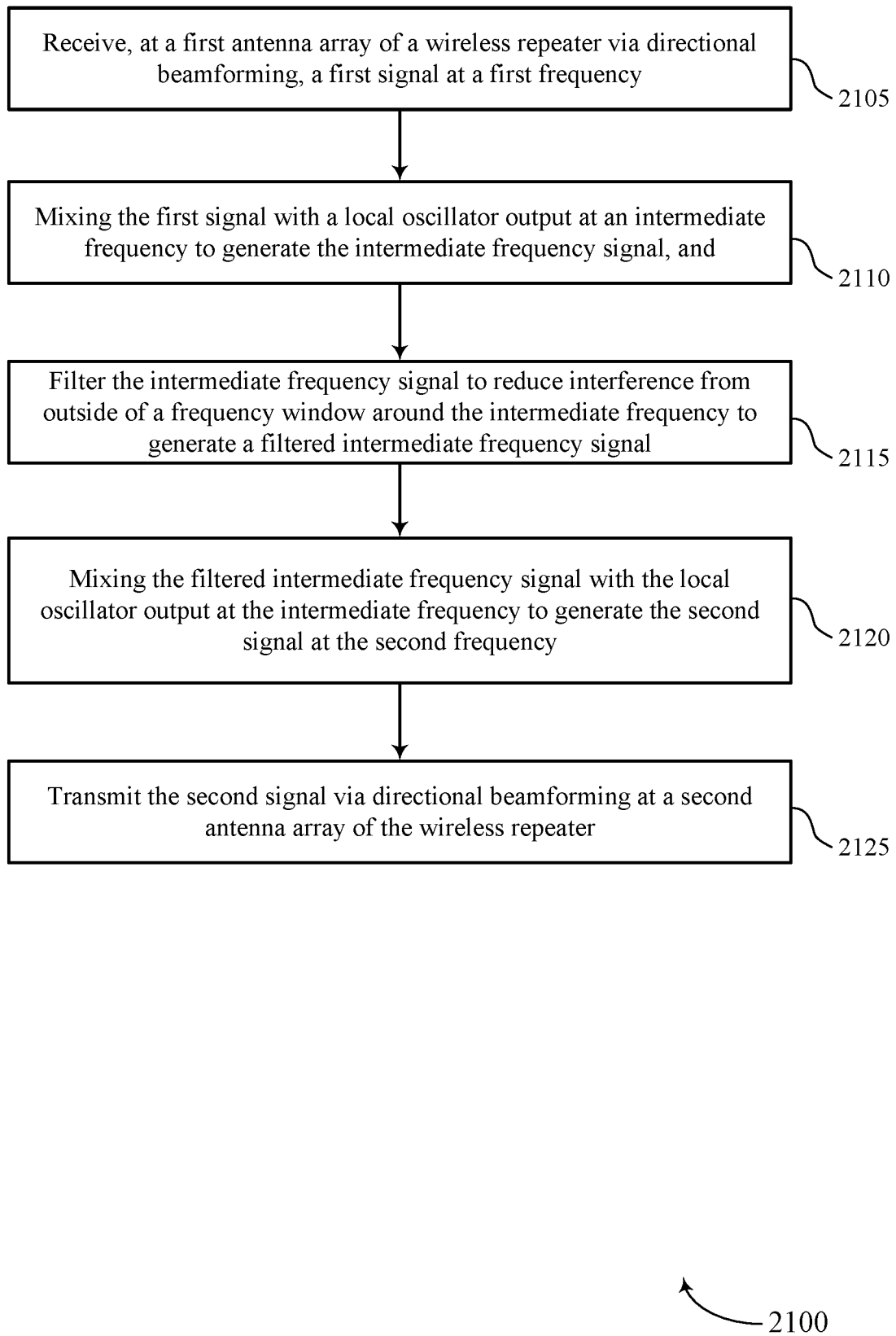

FIG. 21 shows a flowchart illustrating a method 2100 that supports interference mitigation techniques in directional beamforming repeaters in accordance with aspects of the present disclosure. The operations of method 2100 may be implemented by a wireless device or its components as described herein. For example, the operations of method 2100 may be performed by a repeater as described with reference to FIGS. 5-19. In some examples, a wireless device may execute a set of instructions to control the functional elements of the wireless device to perform the functions described herein. Additionally or alternatively, a wireless device may perform aspects of the functions described herein using special-purpose hardware.

At 2105, the wireless device may receive, at a first antenna array of a wireless repeater via directional beamforming, a first signal at a first frequency. The operations of 2105 may be performed according to the methods described herein. In some examples, aspects of the operations of 2105 may be performed by a receive array as described with reference to FIGS. 5-10.

At 2110, the wireless device may perform operations of mixing the first signal with a local oscillator output at an IF to generate an IF signal, where the IF may be lower than the first frequency. The operations of 2110 may be performed according to the methods described herein. In some examples, aspects of the operations of 2110 may be performed by a heterodyning component as described with reference to FIGS. 5-16.

At 2115, the wireless device may filter the IF signal to reduce interference from outside of a frequency window around the IF to generate a filtered IF signal. The operations of 2115 may be performed according to the methods described herein. In some examples, aspects of the operations of 2115 may be performed by a BPF as described with reference to FIGS. 5-16.

At 2120, the wireless device may perform operations of mixing the filtered IF signal with the local oscillator output at the IF to generate the second signal at the second frequency, where the second frequency may be higher than the IF. The operations of 2120 may be performed according to the methods described herein. In some examples, aspects of the operations of 2120 may be performed by a heterodyning component as described with reference to FIGS. 5-16.

At 2125, the wireless device may transmit the second signal via directional beamforming at a second antenna array of the wireless repeater. The operations of 2125 may be performed according to the methods described herein. In some examples, aspects of the operations of 2125 may be performed by a transmit array as described with reference to FIGS. 5-10.

Figure 22:
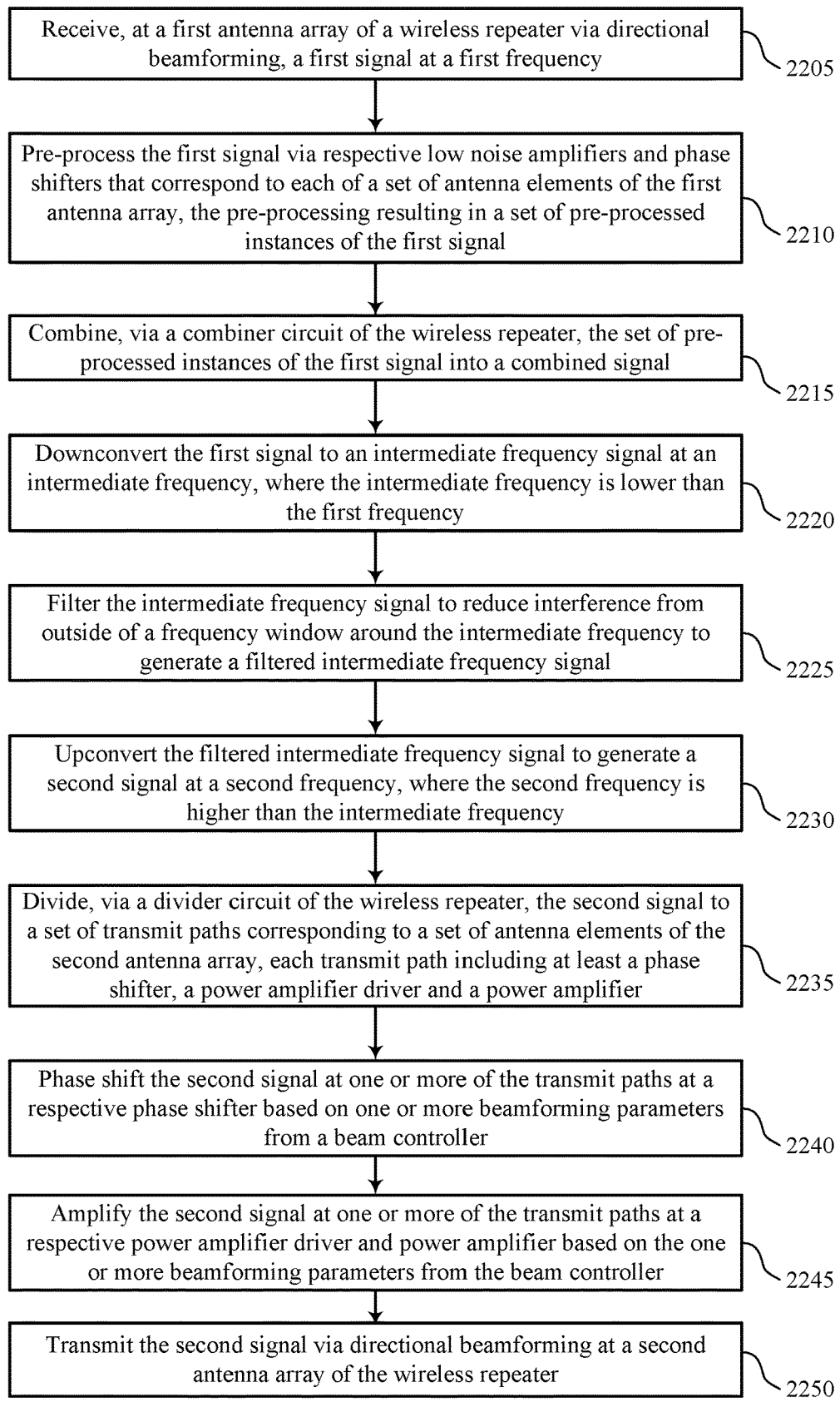

FIG. 22 shows a flowchart illustrating a method 2200 that supports interference mitigation techniques in directional beamforming repeaters in accordance with aspects of the present disclosure. The operations of method 2200 may be implemented by a wireless device or its components as described herein. For example, the operations of method 2200 may be performed by a repeater as described with reference to FIGS. 5-19. In some examples, a wireless device may execute a set of instructions to control the functional elements of the wireless device to perform the functions described herein. Additionally or alternatively, a wireless device may perform aspects of the functions described herein using special-purpose hardware.

At 2205, the wireless device may receive, at a first antenna array of a wireless repeater via directional beamforming, a first signal at a first frequency. The operations of 2205 may be performed according to the methods described herein. In some examples, aspects of the operations of 2205 may be performed by a receive array as described with reference to FIGS. 5-16.

At 2210, the wireless device may pre-process the first signal via respective low noise amplifiers and phase shifters that correspond to each of a set of antenna elements of the first antenna array, the pre-processing resulting in a set of pre-processed instances of the first signal. The operations of 2210 may be performed according to the methods described herein. In some examples, aspects of the operations of 2210 may be performed by an LNA component as described with reference to FIGS. 5-10.

At 2215, the wireless device may combine, via a combiner circuit of the wireless repeater, the set of pre-processed instances of the first signal into a combined signal. The operations of 2215 may be performed according to the methods described herein. In some examples, aspects of the operations of 2215 may be performed by a combiner as described with reference to FIGS. 6-10.

At 2220, the wireless device may downconvert the first signal to an IF signal at an IF, where the IF may be lower than the first frequency. The operations of 2220 may be performed according to the methods described herein. In some examples, aspects of the operations of 2220 may be performed by a heterodyning component or mixer as described with reference to FIGS. 5-16, and 19.

At 2225, the wireless device may filter the IF signal to reduce interference from outside of a frequency window around the IF to generate a filtered IF signal. The operations of 2225 may be performed according to the methods described herein. In some examples, aspects of the operations of 2225 may be performed by a BPF as described with reference to FIGS. 5-16, and 19.

At 2230, the wireless device may upconvert the filtered IF signal to generate a second signal at a second frequency, where the second frequency may be higher than the IF. The operations of 2230 may be performed according to the methods described herein. In some examples, aspects of the operations of 2230 may be performed by a heterodyning component or mixer as described with reference to FIGS. 5-16.

At 2235, the wireless device may divide, via a divider circuit of the wireless repeater, the second signal to a set of transmit paths corresponding to a set of antenna elements of the second antenna array, each transmit path including at least a phase shifter, a power amplifier driver and a power amplifier. The operations of 2235 may be performed according to the methods described herein. In some examples, aspects of the operations of 2235 may be performed by a divider as described with reference to FIGS. 5-10.

At 2240, the wireless device may phase shift the second signal at one or more of the transmit paths at a respective phase shifter based on one or more beamforming parameters from a beam controller. The operations of 2240 may be performed according to the methods described herein. In some examples, aspects of the operations of 2240 may be performed by a phase shifter as described with reference to FIGS. 5-10.

At 2245, the wireless device may amplify the second signal at one or more of the transmit paths at a respective power amplifier driver and power amplifier based on the one or more beamforming parameters from the beam controller. The operations of 2245 may be performed according to the methods described herein. In some examples, aspects of the operations of 2245 may be performed by a PA as described with reference to FIGS. 5-10.

At 2250, the wireless device may transmit the second signal via directional beamforming at a second antenna array of the wireless repeater. The operations of 2250 may be performed according to the methods described herein. In some examples, aspects of the operations of 2250 may be performed by a transmit array as described with reference to FIGS. 5-10.

Figure 23:
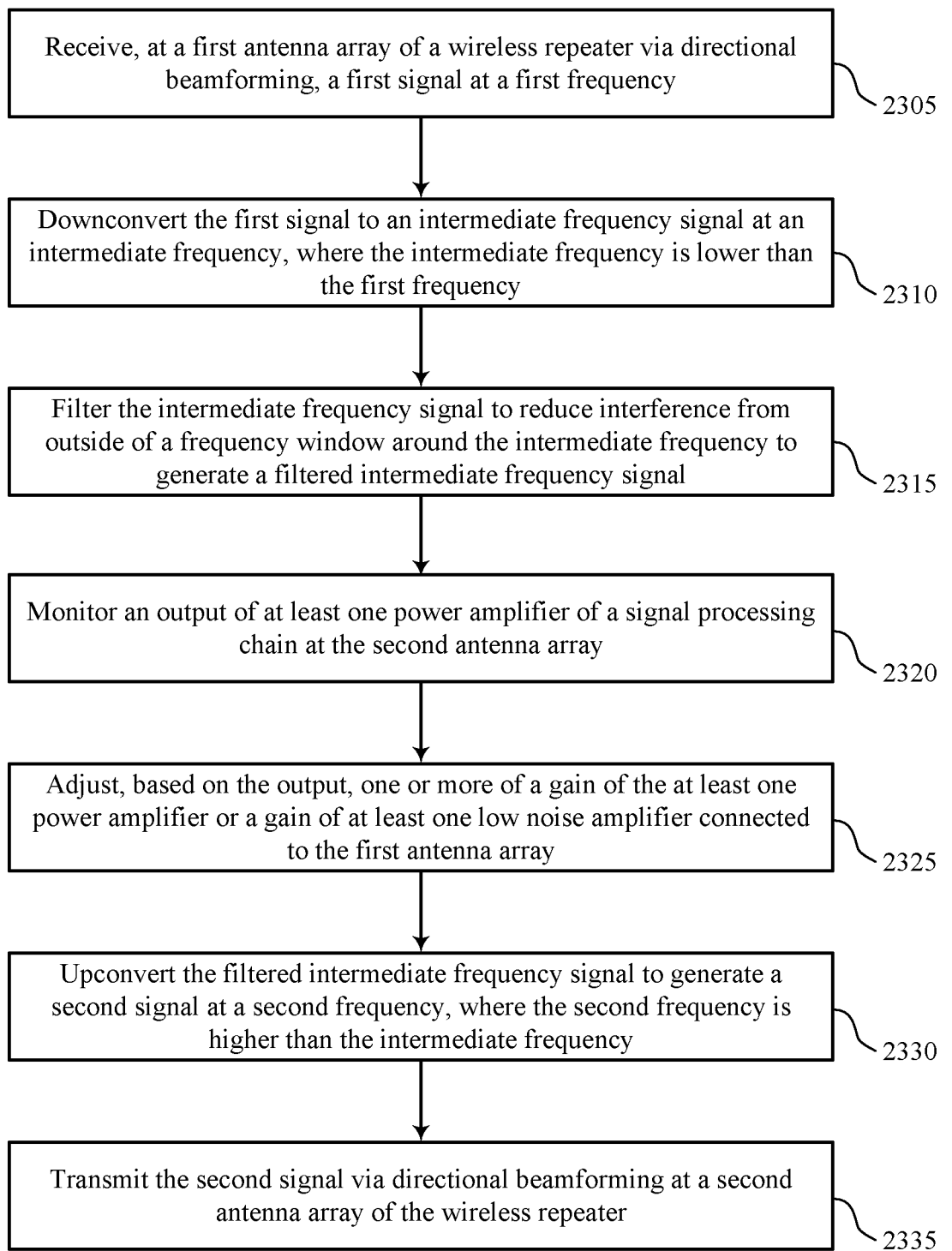

FIG. 23 shows a flowchart illustrating a method 2300 that supports interference mitigation techniques in directional beamforming repeaters in accordance with aspects of the present disclosure. The operations of method 2300 may be implemented by a wireless device or its components as described herein. For example, the operations of method 2300 may be performed by a repeater as described with reference to FIGS. 5-19. In some examples, a wireless device may execute a set of instructions to control the functional elements of the wireless device to perform the functions described herein. Additionally or alternatively, a wireless device may perform aspects of the functions described herein using special-purpose hardware.

At 2305, the wireless device may receive, at a first antenna array of a wireless repeater via directional beamforming, a first signal at a first frequency. The operations of 2305 may be performed according to the methods described herein. In some examples, aspects of the operations of 2305 may be performed by a receive array as described with reference to FIGS. 5-10.

At 2310, the wireless device may downconvert the first signal to an IF signal at an IF, where the IF may be lower than the first frequency. The operations of 2310 may be performed according to the methods described herein. In some examples, aspects of the operations of 2310 may be performed by a heterodyning component or mixer as described with reference to FIGS. 5-16.

At 2315, the wireless device may filter the IF signal to reduce interference from outside of a frequency window around the IF to generate a filtered IF signal. The operations of 2315 may be performed according to the methods described herein. In some examples, aspects of the operations of 2315 may be performed by a BPF as described with reference to FIGS. 5-16.

At 2320, the wireless device may monitor an output of at least one power amplifier of a signal processing chain at the second antenna array. The operations of 2320 may be performed according to the methods described herein. In some examples, aspects of the operations of 2320 may be performed by a beam controller as described with reference to FIGS. 5-10.

At 2325, the wireless device may adjust, based on the output, one or more of a gain of the at least one power amplifier or a gain of at least one low noise amplifier connected to the first antenna array. The operations of 2325 may be performed according to the methods described herein. In some examples, aspects of the operations of 2325 may be performed by a beam controller as described with reference to FIGS. 5-10.

At 2330, the wireless device may upconvert the filtered IF signal to generate a second signal at a second frequency, where the second frequency may be higher than the IF. The operations of 2330 may be performed according to the methods described herein. In some examples, aspects of the operations of 2330 may be performed by a heterodyning component or mixer as described with reference to FIGS. 5-16.

At 2335, the wireless device may transmit the second signal via directional beamforming at a second antenna array of the wireless repeater. The operations of 2335 may be performed according to the methods described herein. In some examples, aspects of the operations of 2335 may be performed by a transmit array as described with reference to FIGS. 5-10.

The electromagnetic spectrum is often subdivided by various authors/entities into differently identified classes, bands, channels, etc., based on frequency/wavelength. For example, a portion of the electromagnetic spectrum from 30 Hz to 300 GHz is commonly known as the radio spectrum with the corresponding electromagnetic waves often called radio waves.

The International Telecommunications Union (ITU), for example, currently identifies twelve differently named bands in the radio spectrum based on powers of ten meters of wavelength. Here, for example, of particular interest to modern wireless communications are certain radio frequencies/bands within the ITU's very high frequency (VHF) band (30 MHZ-300 MHz), ultra high frequency (UHF) band (300 MHz-3000 MHz), super high frequency (SHF) band (3000 MHz-30000 MHz), and/or extremely high frequency (EHF) band (30000 MHz-300000 MHz).

In another example, the Institute of Electrical and Electronics Engineers (IEEE) recognizes the same VHF and UHF bands of the ITU, but divides the radio spectrum (300 MHz-300000 MHz), corresponding to the ITU's UHF, SHF and EHF bands, into ten differently named bands.

One of the issues that may arise from having different authors/entities naming portions of the radio spectrum is that some potential confusion may arise. For example, the ITU's EHF band (30000 MHz-300000 MHz) corresponds to wavelengths between 1 mm and 10 mm and as such is often referred to a millimeter wave band. However, the (narrower) IEEE band designated as the "G" band (110000 MHz-300000 MHz) is also often referred to as a millimeter wave band.

For 5G new radio (NR), two initial operating bands have been identified as frequency range designations FR1 (410 MHz-7125 MHz) and FR2 (24250 MHz-52600 MHz). It is expected that other frequency range designations may be identified for 5G, or later generations. Even though a portion of FR1 is greater than both 6 GHz (>6000 MHz) and 7 GHz (>7000 MHz), FR1 is often referred to as a Sub-6 GHz band or a Sub-7 GHz band in various documents and articles regarding 5G NR topics. A similar nomenclature issue sometimes occurs with regard to FR2 in various documents and articles regarding 5G NR topics. While a portion of FR2 is less than 30 GHz (<30000 MHz, e.g., the lower end of the EHF band), FR2 is often referred to as a millimeter wave band in various documents and articles regarding 5G NR topics. Additionally, all or some of the frequencies between the upper bound of FR1 (currently, 7125 MHz) and the lower band of FR2 (currently, 24250 MHz) are often referred to as mid-band frequencies.

With the above examples in mind, unless specifically stated otherwise, it should be understood that the term "sub-6 GHz" or the like if used herein by way of example may represent all or part of FR1 for 5G NR. Further, unless specifically stated otherwise, it should be understood that the term "millimeter wave" if used herein by way of example may represent all or part of FR2 for 5G NR, and/or all or part of the EHF band.

It should also be understood that the terms "sub-6 GHz" and "millimeter wave" are also intended herein to represent modifications to such example frequency bands that may occur do to author/entity decisions regarding wireless communications, e.g., as presented by example herein. For example, unless specifically stated otherwise, it should be understood that the terms "sub-6 GHz" and "millimeter wave" if used herein may also represent respective (non-overlapping) portions of the so-called mid-band frequencies.

It should be understood that the above examples are not necessarily intended to limit claimed subject matter. For example, unless specifically recited, claimed subject matter relating to wireless communications is not necessarily intended to be limited to any particular author/entity defined frequency band, or the like.

It should be noted that the methods described herein describe possible implementations, and that the operations and the steps may be rearranged or otherwise modified and that other implementations are possible. Further, aspects from two or more of the methods may be combined.

Aspects of the following examples may be combined with any of the previous examples or aspects described herein.

Example 1

A method of wireless communications comprising receiving, at a first antenna array of a wireless repeater via directional beamforming, a first signal at a first frequency, downconverting the first signal to an intermediate frequency signal at an intermediate frequency, where the intermediate frequency may be lower than the first frequency, filtering the intermediate frequency signal to reduce interference from outside of a frequency window around the intermediate frequency to generate a filtered intermediate frequency signal, upconverting the filtered intermediate frequency signal to generate a second signal at a second frequency, where the second frequency may be higher than the intermediate frequency, and transmitting the second signal via directional beamforming at a second antenna array of the wireless repeater.

Example 2

The method of example 1 further comprising amplifying the filtered intermediate frequency signal at a power amplifier to generate an amplified intermediate frequency signal.

Example 3

The method of example 2, where the amplified intermediate frequency signal comprises a signal of interest within the frequency window and one or more interference signals outside of the frequency window, and wherein a first magnitude of the signal of interest exceeds a second magnitude of the one or more interference signals.

Example 4

The method of example 1, where the downconverting the first signal comprises mixing the first signal with a local oscillator output at the intermediate frequency to generate the intermediate frequency signal, and the upconverting the filtered intermediate frequency signal to generate the second signal comprises mixing the filtered intermediate frequency signal with the local oscillator output at the intermediate frequency to generate the second signal at the second frequency.

Example 5

The method of example 4, where the local oscillator output is generated by a fixed frequency local oscillator at the intermediate frequency.

Example 6

The method of example 4, where the local oscillator output is generated by a voltage controlled oscillator that is tuned based at least in part on an output of a carrier tracking component that provides carrier tracking of the first frequency.

Example 7

The method of example 6, where the carrier tracking component receives an input associated with carrier tracking of the first frequency from a control link with a transmitter of the first signal, and wherein the control link is separate from the first signal.

Example 8

The method of examples 6 or 7, where the carrier tracking component comprises a phase locked loop circuit.

Example 9

The method of any of examples 6 to 8, where the phase locked loop circuit comprises one or more of a Costas phase locked loop, a Costas phase locked loop with a frequency divider, an analog cross-correlation circuit that provides analog cross-correlation feedback based at least in part on a synchronization signal transmitted with the first signal, a non-linearity generator and divider to extract integer multiples of the intermediate frequency, or any combinations thereof.

Example 10

The method of any of examples 1 to 9, where the receiving the first signal at the first frequency further comprises pre-processing the first signal via respective low noise amplifiers and phase shifters that correspond to each of a plurality of antenna elements of the first antenna array, the pre-processing resulting in a plurality of pre-processed instances of the first signal, and combining, via a combiner circuit of the wireless repeater, the plurality of pre-processed instances of the first signal into a combined signal.

Example 11

The method of any of examples 1 to 10, where the transmitting the second signal at the second frequency further comprises dividing, via a divider circuit of the wireless repeater, the second signal to a plurality of transmit paths corresponding to a plurality of antenna elements of the second antenna array, each transmit path including at least a phase shifter, a power amplifier driver and a power amplifier, phase shifting the second signal at one or more of the transmit paths at a respective phase shifter based at least in part on one or more beamforming parameters from a beam controller, and amplifying the second signal at one or more of the transmit paths at a respective power amplifier driver and power amplifier based at least in part on the one or more beamforming parameters from the beam controller.

Example 12

The method of any of examples 1 to 11, where the receiving the first signal at the first frequency further comprises phase shifting the first signal via respective phase shifters that correspond to each of a plurality of antenna elements of the first antenna array to generate a plurality of phase shifted instances of the first signal, the phase shifting based at least in part on one or more receive beamforming parameters from a beam controller, combining, via a combiner circuit of the wireless repeater, the plurality of phase shifted instances of the first signal into a combined signal, and amplifying, via a low noise amplifier of the first antenna array, the combined signal.

Example 13

The method of any of examples 1 to 12, where the transmitting the second signal at the second frequency further comprises amplifying the second signal using a power amplifier driver and a power amplifier of the wireless repeater to generate an amplified second signal, dividing, via a divider circuit of the wireless repeater, the amplified second signal to a plurality of transmit paths corresponding to a plurality of antenna elements of the second antenna array, each transmit path including at least a phase shifter, and phase shifting the second signal at one or more of the plurality of transmit paths based at least in part on one or more beamforming parameters from a beam controller.

Example 14

The method of any of examples 1 to 13, where the receiving the first signal comprises performing receive directional beamforming at the first frequency or at the intermediate frequency, and wherein the transmitting the second signal comprises performing transmit directional beamforming at the second frequency or at the intermediate frequency.

Example 15

The method of any of examples 1 to 14, where the first frequency has a same nominal frequency as the second frequency.

Example 16

The method of any of examples 1 to 15, where the filtering comprises providing the intermediate frequency signal to a surface acoustic wave filter or bulk acoustic wave filter.

Example 17

The method of any of examples 1 to 16, where one or more components of the wireless repeater, including one or more of the first antenna array, the second antenna array, one or more switches, one or more couplers, one or more combiners, one or more splitters, one or more filters, one or more phase-shifters, one or more connecting elements, or any combinations thereof, comprise a meta-material or a material with tunable permittivity and permeability.

Example 18

The method of any of examples 1 to 17, where the filtering further filters interference caused by coupling between the second antenna array and the first antenna array.

Example 19

The method of example 18, further comprising monitoring an output of at least one power amplifier of a signal processing chain at the second antenna array, and adjusting, based at least in part on the output, one or more of a gain of the at least one power amplifier or a gain of at least one low noise amplifier connected to the first antenna array.

Example 20

The method of examples 18 and 19, where monitoring the output of the at least one power amplifier of the signal processing chain comprises monitoring the output of the at least one power amplifier via a feedback path connected to the signal processing chain between the first antenna array and the second antenna array.

Example 21

The method examples 18 to 20, where the feedback path comprises a coupler for connecting to the signal processing chain, a power detector for monitoring the output of the power amplifier, and a gain controller for adjusting the gain of the power amplifier driver to the power amplifier.

Example 22

An apparatus for wireless communications comprising a processor; memory in electronic communication with the processor; and instructions stored in the memory and executable by the processor to cause the apparatus to perform a method of any of examples 1 to 21.

Example 23

An apparatus comprising at least one means for performing a method of any of examples 1 to 21.

Example 24

A non-transitory computer-readable medium storing code for wireless communications, the code comprising instructions executable by a processor to perform a method of any of examples 1 to 21.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    receiving, at a first antenna array of a wireless repeater via directional beamforming, a first signal at a first frequency;
    downconverting the first signal to an intermediate frequency signal at an intermediate frequency, wherein the intermediate frequency is lower than the first frequency;
    filtering the intermediate frequency signal to reduce interference from outside of a frequency window around the intermediate frequency to generate a filtered intermediate frequency signal;
    amplifying the filtered intermediate frequency signal at a power amplifier to generate an amplified intermediate frequency signal comprising a signal of interest within the frequency window and one or more interference signals outside of the frequency window, wherein a first magnitude of the signal of interest exceeds a second magnitude of the one or more interference signals;
    upconverting the filtered intermediate frequency signal to generate a second signal at a second frequency, wherein the second frequency is higher than the intermediate frequency; and
    transmitting the second signal via directional beamforming at a second antenna array of the wireless repeater.

2. The method of claim 1, wherein:
    the downconverting the first signal comprises mixing the first signal with a local oscillator output at the intermediate frequency to generate the intermediate frequency signal; and
    the upconverting the filtered intermediate frequency signal to generate the second signal comprises mixing the filtered intermediate frequency signal with the local oscillator output at the intermediate frequency to generate the second signal at the second frequency.

3. The method of claim 2, wherein the local oscillator output is generated by a fixed frequency local oscillator at the intermediate frequency.

4. The method of claim 2, wherein the local oscillator output is generated by a voltage controlled oscillator that is tuned based at least in part on an output of a carrier tracking component that provides carrier tracking of the first frequency.

5. The method of claim 4, wherein the carrier tracking component receives an input associated with carrier tracking of the first frequency from a control link with a transmitter of the first signal, and wherein the control link is separate from the first signal.

6. The method of claim 4, wherein the carrier tracking component comprises a phase locked loop circuit.

7. The method of claim 6, wherein the phase locked loop circuit comprises one or more of a Costas phase locked loop, a Costas phase locked loop with a frequency divider, an analog cross-correlation circuit that provides analog cross-correlation feedback based at least in part on a synchronization signal transmitted with the first signal, a non-linearity generator and divider to extract integer multiples of the intermediate frequency, or any combinations thereof.

8. The method of claim 1, wherein the receiving the first signal at the first frequency further comprises:
pre-processing the first signal via respective low noise amplifiers and phase shifters that correspond to each of a plurality of antenna elements of the first antenna array, the pre-processing resulting in a plurality of pre-processed instances of the first signal; and
combining, via a combiner circuit of the wireless repeater, the plurality of pre-processed instances of the first signal into a combined signal.

9. The method of claim 1, wherein the transmitting the second signal at the second frequency further comprises:
dividing, via a divider circuit of the wireless repeater, the second signal to a plurality of transmit paths corresponding to a plurality of antenna elements of the second antenna array, each transmit path including at least a phase shifter, a power amplifier driver and a power amplifier;
phase shifting the second signal at one or more of the transmit paths at a respective phase shifter based at least in part on one or more beamforming parameters from a beam controller; and
amplifying the second signal at one or more of the transmit paths at a respective power amplifier driver and power amplifier based at least in part on the one or more beamforming parameters from the beam controller.

10. The method of claim 1, wherein the receiving the first signal at the first frequency further comprises:
phase shifting the first signal via respective phase shifters that correspond to each of a plurality of antenna elements of the first antenna array to generate a plurality of phase shifted instances of the first signal, the phase shifting based at least in part on one or more receive beamforming parameters from a beam controller;
combining, via a combiner circuit of the wireless repeater, the plurality of phase shifted instances of the first signal into a combined signal; and
amplifying, via a low noise amplifier of the first antenna array, the combined signal.

11. The method of claim 1, wherein the transmitting the second signal at the second frequency further comprises:
amplifying the second signal using a power amplifier driver and a power amplifier of the wireless repeater to generate an amplified second signal;
dividing, via a divider circuit of the wireless repeater, the amplified second signal to a plurality of transmit paths corresponding to a plurality of antenna elements of the second antenna array, each transmit path including at least a phase shifter; and
phase shifting the second signal at one or more of the plurality of transmit paths based at least in part on one or more beamforming parameters from a beam controller.

12. The method of claim 1, wherein the receiving the first signal comprises performing receive directional beamforming at the first frequency or at the intermediate frequency, and wherein the transmitting the second signal comprises performing transmit directional beamforming at the second frequency or at the intermediate frequency.

13. The method of claim 1, wherein the first frequency has a same nominal frequency as the second frequency.

14. The method of claim 1, wherein the filtering comprises providing the intermediate frequency signal to a surface acoustic wave filter or bulk acoustic wave filter.

15. The method of claim 1, wherein one or more components of the wireless repeater, including one or more of the first antenna array, the second antenna array, one or more switches, one or more couplers, one or more combiners, one or more splitters, one or more filters, one or more phase-shifters, one or more connecting elements, or any combinations thereof, comprise a meta-material or a material with tunable permittivity and permeability.

16. The method of claim 1, wherein the filtering further filters interference caused by coupling between the second antenna array and the first antenna array.

17. The method of claim 16, further comprising:
monitoring an output of at least one power amplifier of a signal processing chain at the second antenna array; and
adjusting, based at least in part on the output, one or more of a gain of the at least one power amplifier or a gain of at least one low noise amplifier connected to the first antenna array.

18. The method of claim 17, wherein monitoring the output of the at least one power amplifier of the signal processing chain comprises:
monitoring the output of the at least one power amplifier via a feedback path connected to the signal processing chain between the first antenna array and the second antenna array.

19. The method of claim 18, wherein the feedback path comprises a coupler for connecting to the signal processing chain, a power detector for monitoring the output of the power amplifier, and a gain controller for adjusting the gain of a power amplifier driver to the power amplifier.

20. An apparatus for wireless communication, comprising: a processor, memory in electronic communication with the processor; and instructions stored in the memory and executable by the processor to cause the apparatus to:
receive, at a first antenna array of a wireless repeater via directional beamforming, a first signal at a first frequency;
downconvert the first signal to an intermediate frequency signal at an intermediate frequency, wherein the intermediate frequency is lower than the first frequency;
filter the intermediate frequency signal to reduce interference from outside of a frequency window around the intermediate frequency to generate a filtered intermediate frequency signal;
amplify the filtered intermediate frequency signal at a power amplifier to generate an amplified intermediate frequency signal comprising a signal of interest within the frequency window and one or more interference signals outside of the frequency window, wherein a first magnitude of the signal of interest exceeds a second magnitude of the one or more interference signals;

upconvert the filtered intermediate frequency signal to generate a second signal at a second frequency, wherein the second frequency is higher than the intermediate frequency; and transmit the second signal via directional beamforming at a second antenna array of the wireless repeater.

21. The apparatus of claim 20, wherein:
the instructions to cause the apparatus to downconvert the first signal are executable by the processor to cause the apparatus to mix the first signal with a local oscillator output at the intermediate frequency to generate the intermediate frequency signal; and
the instructions to cause the apparatus to upconvert the filtered intermediate frequency signal to generate the second signal are executable by the processor to cause the apparatus to mix the filtered intermediate frequency signal with the local oscillator output at the intermediate frequency to generate the second signal at the second frequency.

22. The apparatus of claim 20, wherein the instructions to cause the apparatus to receive the first signal at the first frequency are executable by the processor to cause the apparatus to:
pre-process the first signal via respective low noise amplifiers and phase shifters that correspond to each of a plurality of antenna elements of the first antenna array, the pre-processing resulting in a plurality of pre-processed instances of the first signal; and
combine, via a combiner circuit of the wireless repeater, the plurality of pre-processed instances of the first signal into a combined signal.

23. The apparatus of claim 20, wherein the instructions to cause the apparatus to transmit the second signal at the second frequency are executable by the processor to cause the apparatus to:
divide, via a divider circuit of the wireless repeater, the second signal to a plurality of transmit paths corresponding to a plurality of antenna elements of the second antenna array, each transmit path including at least a phase shifter, a power amplifier driver and a power amplifier;
phase shift the second signal at one or more of the transmit paths at a respective phase shifter based at least in part on one or more beamforming parameters from a beam controller; and
amplify the second signal at one or more of the transmit paths at a respective power amplifier driver and power amplifier based at least in part on the one or more beamforming parameters from the beam controller.

24. The apparatus of claim 20, wherein the instructions to cause the apparatus to receive the first signal at the first frequency are executable by the processor to cause the apparatus to:
phase shift the first signal via respective phase shifters that correspond to each of a plurality of antenna elements of the first antenna array to generate a plurality of phase shifted instances of the first signal, the phase shifting based at least in part on one or more receive beamforming parameters from a beam controller;
combine, via a combiner circuit of the wireless repeater, the plurality of phase shifted instances of the first signal into a combined signal; and
amplify, via a low noise amplifier of the first antenna array, the combined signal.

25. The apparatus of claim 20, wherein the instructions to cause the apparatus to transmit the second signal at the second frequency are executable by the processor to cause the apparatus to:
amplify the second signal using a power amplifier driver and a power amplifier of the wireless repeater to generate an amplified second signal;
divide, via a divider circuit of the wireless repeater, the amplified second signal to a plurality of transmit paths corresponding to a plurality of antenna elements of the second antenna array, each transmit path including at least a phase shifter; and
phase shift the second signal at one or more of the plurality of transmit paths based at least in part on one or more beamforming parameters from a beam controller.

26. An apparatus for wireless communication, comprising:
means for receiving, at a first antenna array of a wireless repeater via directional beamforming, a first signal at a first frequency;
means for downconverting the first signal to an intermediate frequency signal at an intermediate frequency, wherein the intermediate frequency is lower than the first frequency;
means for filtering the intermediate frequency signal to reduce interference from outside of a frequency window around the intermediate frequency to generate a filtered intermediate frequency signal;
means for amplifying the filtered intermediate frequency signal at a power amplifier to generate an amplified intermediate frequency signal comprising a signal of interest within the frequency window and one or more interference signals outside of the frequency window, wherein a first magnitude of the signal of interest exceeds a second magnitude of the one or more interference signals;
means for upconverting the filtered intermediate frequency signal to generate a second signal at a second frequency, wherein the second frequency is higher than the intermediate frequency; and
means for transmitting the second signal via directional beamforming at a second antenna array of the wireless repeater.

27. A non-transitory computer-readable medium storing code for wireless communication, the code comprising instructions executable by a processor to:
receive, at a first antenna array of a wireless repeater via directional beamforming, a first signal at a first frequency;
downconvert the first signal to an intermediate frequency signal at an intermediate frequency, wherein the intermediate frequency is lower than the first frequency;
filter the intermediate frequency signal to reduce interference from outside of a frequency window around the intermediate frequency to generate a filtered intermediate frequency signal;
amplify the filtered intermediate frequency signal at a power amplifier to generate an amplified intermediate frequency signal comprising a signal of interest within the frequency window and one or more interference signals outside of the frequency window, wherein a first magnitude of the signal of interest exceeds a second magnitude of the one or more interference signals;

upconvert the filtered intermediate frequency signal to generate a second signal at a second frequency, wherein the second frequency is higher than the intermediate frequency; and transmit the second signal via directional beamforming at a second antenna array of the wireless repeater.

\* \* \* \* \*